US010690293B2

(12) United States Patent
Jiang et al.

(10) Patent No.: US 10,690,293 B2
(45) Date of Patent: Jun. 23, 2020

(54) LED LIGHT BULB WITH TWO SETS OF FILAMENTS

(71) Applicant: ZHEJIANG SUPER LIGHTING ELECTRIC APPLIANCE CO., LTD., Zhejiang (CN)

(72) Inventors: Tao Jiang, Jiaxing (CN); Liqin Li, Jiaxing (CN)

(*) Notice: Subject to any disclaimer, the term of this patent is extended or adjusted under 35 U.S.C. 154(b) by 3 days.

(21) Appl. No.: 16/262,798

(22) Filed: Jan. 30, 2019

(65) Prior Publication Data

US 2019/0162370 A1    May 30, 2019

Related U.S. Application Data

(63) Continuation of application No. 15/499,143, filed on Apr. 27, 2017, now Pat. No. 10,240,724, which is a
(Continued)

(30) Foreign Application Priority Data

Aug. 17, 2015 (CN) .......................... 2015 1 0502630
Dec. 19, 2015 (CN) .......................... 2015 1 0966906
(Continued)

(51) Int. Cl.
*H01L 27/15* (2006.01)
*H01L 27/32* (2006.01)
(Continued)

(52) U.S. Cl.
CPC .............. *F21K 9/237* (2016.08); *F21K 9/232* (2016.08); *F21K 9/235* (2016.08); *F21K 9/238* (2016.08);
(Continued)

(58) Field of Classification Search
CPC .......... F21K 9/232; F21K 9/235; F21K 9/237; H01K 1/18; F21V 9/30; H01L 27/32
See application file for complete search history.

(56) References Cited

U.S. PATENT DOCUMENTS 8,455,895 B2    6/2013    Chai et al.
8,933,619 B1    1/2015    Ou
(Continued)

FOREIGN PATENT DOCUMENTS

CN        201448620 U    5/2010
CN        101826588 A    9/2010
(Continued)

*Primary Examiner* — Karabi Guharay
(74) *Attorney, Agent, or Firm* — Simon Kuang Lu

(57) ABSTRACT

An LED light bulb includes a bulb shell, a bulb base, a stem, conductive supports, an LED filament, and a supporting arm. The bulb base is connected to the bulb shell. The stem is connected to the bulb base. The conductive supports are connected to the stem. The LED filament includes a filament body and two conductive electrodes. The conductive electrodes are at two ends of the filament body and connected to the conductive supports. The filament body is around the stem. The supporting arm is connected to the stem and the filament body. In a height direction of the LED light bulb, H is a distance from a bottom to a top of the bulb shell. A first height difference is defined between the two conductive electrodes and is from 0 to ⅒H. The filament body is curved to form a highest point and a lowest point. A second height difference is defined between the highest point and the lowest point. The first height difference is less than the second height difference.

16 Claims, 9 Drawing Sheets

Related U.S. Application Data continuation-in-part of application No. 15/384,311, filed on Dec. 19, 2016, now Pat. No. 10,487,987, which is a continuation-in-part of application No. 15/366,535, filed on Dec. 1, 2016, now Pat. No. 10,473,271, which is a continuation-in-part of application No. 15/237,983, filed on Aug. 16, 2016, now Pat. No. 10,228,093.

(30) Foreign Application Priority Data

| Jan. 22, 2016 | (CN) | 2016 1 0041667 |
|---|---|---|
| Apr. 27, 2016 | (CN) | 2016 1 0272153 |
| Apr. 29, 2016 | (CN) | 2016 1 0281600 |
| Jun. 3, 2016 | (CN) | 2016 1 0394610 |
| Jul. 7, 2016 | (CN) | 2016 1 0544049 |
| Jul. 22, 2016 | (CN) | 2016 1 0586388 |
| Nov. 1, 2016 | (CN) | 2016 1 0936171 |
| Dec. 6, 2016 | (CN) | 2016 1 1108722 |
| Jan. 13, 2017 | (CN) | 2017 1 0024877 |
| Feb. 14, 2017 | (CN) | 2017 1 0079423 |
| Mar. 9, 2017 | (CN) | 2017 1 0138009 |
| Mar. 23, 2017 | (CN) | 2017 1 0180574 |
| Apr. 11, 2017 | (CN) | 2017 1 0234618 |

(51) Int. Cl.

| F21K 9/237 | (2016.01) |
|---|---|
| F21K 9/232 | (2016.01) |
| F21V 3/02 | (2006.01) |
| F21K 9/235 | (2016.01) |
| F21V 29/70 | (2015.01) |
| F21V 9/30 | (2018.01) |
| F21K 9/238 | (2016.01) |
| F21Y 115/10 | (2016.01) |
| F21K 9/90 | (2016.01) |
| F21V 19/00 | (2006.01) |
| H01L 23/00 | (2006.01) |
| H01L 25/075 | (2006.01) |
| F21Y 103/33 | (2016.01) |
| F21Y 103/37 | (2016.01) |
| F21Y 107/00 | (2016.01) |
| F21V 3/06 | (2018.01) |

(52) U.S. Cl.

CPC ............ *F21V 3/02* (2013.01); *F21V 9/30* (2018.02); *F21V 29/70* (2015.01); *F21K 9/90* (2013.01); *F21V 3/061* (2018.02); *F21V 3/062* (2018.02); *F21V 19/003* (2013.01); *F21Y 2103/33* (2016.08); *F21Y 2103/37* (2016.08); *F21Y 2107/00* (2016.08); *F21Y 2115/10* (2016.08); *H01L 24/45* (2013.01); *H01L 24/48* (2013.01); *H01L 25/0753* (2013.01); *H01L 2224/45144* (2013.01); *H01L 2224/45147* (2013.01); *H01L 2224/48091* (2013.01); *H01L 2224/48092* (2013.01); *H01L 2224/48137* (2013.01); *H01L 2924/00014* (2013.01); *H01L 2924/181* (2013.01); *H01L 2924/19107* (2013.01)

(56) References Cited

U.S. PATENT DOCUMENTS

| 9,016,900 | B2 | 4/2015 | Takeuchi et al. |
|---|---|---|---|
| 9,488,767 | B2 | 11/2016 | Nava et al. |
| 9,761,765 | B2 | 9/2017 | Basin et al. |
| 9,982,854 | B2 | 5/2018 | Ma et al. |
| 10,544,905 | B2 * | 1/2020 | Jiang ............... H05B 45/00 |
| 2004/0008525 | A1 * | 1/2004 | Shibata ............ F21K 9/232 |
|  |  |  | 313/271 |
| 2009/0184618 | A1 | 7/2009 | Hakata et al. |
| 2012/0119647 | A1 | 5/2012 | Hsu |
| 2013/0058080 | A1 | 3/2013 | Ge et al. |
| 2013/0058580 | A1 | 3/2013 | Ge et al. |
| 2013/0147348 | A1 | 6/2013 | Motoya et al. |
| 2013/0235592 | A1 | 9/2013 | Takeuchi et al. |
| 2013/0265796 | A1 | 10/2013 | Kwisthout |
| 2013/0293098 | A1 | 11/2013 | Li et al. |
| 2014/0268779 | A1 | 9/2014 | Sorensen et al. |
| 2014/0369036 | A1 | 12/2014 | Feng |
| 2015/0069442 | A1 | 3/2015 | Liu et al. |
| 2015/0070871 | A1 | 3/2015 | Chen et al. |
| 2015/0255440 | A1 | 9/2015 | Hsieh |
| 2016/0377237 | A1 | 12/2016 | Zhang |
| 2017/0012177 | A1 | 1/2017 | Trottier |
| 2017/0016582 | A1 | 1/2017 | Yang et al. |
| 2017/0122498 | A1 * | 5/2017 | Zalka ............... F21K 9/90 |
| 2017/0167663 | A1 | 6/2017 | Hsiao et al. |
| 2019/0032858 | A1 * | 1/2019 | Cao ............... F21K 9/238 |

FOREIGN PATENT DOCUMENTS

| CN | 102121576 A | 7/2011 |
|---|---|---|
| CN | 202209551 U | 5/2012 |
| CN | 202252991 U | 5/2012 |
| CN | 202253168 U | 5/2012 |
| CN | 102751274 A | 10/2012 |
| CN | 202719450 U | 2/2013 |
| CN | 103123949 A | 5/2013 |
| CN | 203367275 U | 12/2013 |
| CN | 203367375 U | 12/2013 |
| CN | 103560128 A | 2/2014 |
| CN | 103682042 A | 3/2014 |
| CN | 103890481 A | 6/2014 |
| CN | 203628391 U | 6/2014 |
| CN | 203656627 U | 6/2014 |
| CN | 103939758 A | 7/2014 |
| CN | 103956421 A | 7/2014 |
| CN | 103972364 A | 8/2014 |
| CN | 103994349 A | 8/2014 |
| CN | 203857313 U | 10/2014 |
| CN | 203880468 U | 10/2014 |
| CN | 204062539 U | 12/2014 |
| CN | 104295945 A | 1/2015 |
| CN | 104319345 A | 1/2015 |
| CN | 204083941 U | 1/2015 |
| CN | 104456165 A | 3/2015 |
| CN | 204289439 U | 4/2015 |
| CN | 104600174 A | 5/2015 |
| CN | 104600181 A | 5/2015 |
| CN | 204328550 U | 5/2015 |
| CN | 204387765 U | 6/2015 |
| CN | 104913217 A | 9/2015 |
| CN | 105042354 A | 11/2015 |
| CN | 105090789 A | 11/2015 |
| CN | 105140381 A | 12/2015 |
| CN | 105161608 A | 12/2015 |
| CN | 105371243 A | 3/2016 |
| CN | 205081145 U | 3/2016 |
| CN | 105609621 A | 5/2016 |
| CN | 106468405 A | 3/2017 |
| CN | 106898681 A | 6/2017 |
| CN | 107123641 A | 9/2017 |
| CN | 107170733 A | 9/2017 |
| CN | 206563190 U | 10/2017 |
| CN | 107314258 A | 11/2017 |
| CN | 206973307 U | 2/2018 |
| CN | 207034659 U | 2/2018 |
| CN | 108039402 A | 5/2018 |
| CN | 105090782 B | 7/2018 |
| CN | 105098032 A | 7/2018 |
| CN | 207849021 U | 9/2018 |
| EP | 2535640 A1 | 12/2012 |
| EP | 2760057 A1 | 7/2014 |
| EP | 2567145 B1 | 4/2016 |
| GB | 2547085 A | 8/2017 |

(56) References Cited

FOREIGN PATENT DOCUMENTS

| | | | |
|---|---|---|---|
| JP | 3075689 | U | 2/2001 |
| JP | 2001126510 | A | 5/2001 |
| JP | 2003037239 | A | 2/2003 |
| JP | 2013225587 | A | 10/2013 |
| WO | 2014012346 | A1 | 1/2014 |
| WO | 2014167458 | A1 | 10/2014 |
| WO | 2017037010 | A1 | 3/2017 |

* cited by examiner

LED LIGHT BULB WITH TWO SETS OF FILAMENTS

RELATED APPLICATIONS

The present application claims priority to CN201510502630.3 filed Aug. 17, 2015, CN201510966906.3 filed Dec. 19, 2015, CN201610041667.5 filed Jan. 22, 2016, CN201610281600.9 filed Apr. 29, 2016, CN201610272153.0 filed Apr. 27, 2016, CN201610394610.3 filed Jun. 3, 2016, CN201610586388.7 filed Jul. 22, 2016, CN201610544049.2 filed Jul. 7, 2016, CN201610936171.4 filed Nov. 1, 2016, CN201611108722.4 filed Dec. 6, 2016, CN201710024877.8 filed Jan. 13, 2017, CN201710079423.0 filed Feb. 14, 2017, CN201710138009.2 filed Mar. 9, 2017, CN201710180574.5 filed Mar. 23, 2017, and CN 201710234618.8 filed Apr. 11, 2017, each of which is incorporated herein by reference in its entirety.

The present application is a continuation application of Ser. No. 15/499,143, which is a continuation-in-part application of U.S. Ser. No. 15/384,311 filed Dec. 19, 2016, which claims priority to CN201510502630.3 filed Aug. 17, 2015, CN201510966906.3 filed Dec. 19, 2015, CN201610041667.5 filed Jan. 22, 2016, CN201610281600.9 filed Apr. 29, 2016, CN201610272153.0 filed Apr. 27, 2016, CN201610394610.3 filed Jun. 3, 2016, CN201610586388.7 filed Jul. 22, 2016, CN201610544049.2 filed Jul. 7, 2016, CN201610936171.4 filed Nov. 1, 2016 and CN201611108722.4 filed Dec. 6, 2016, which is a continuation-in-part application of U.S. Ser. No. 15/366,535 filed Dec. 1, 2016, which claims priority to CN201510502630.3 filed Aug. 17, 2015, CN201510966906.3 filed Dec. 19, 2015, CN201610041667.5 filed Jan. 22, 2016, CN201610281600.9 filed Apr. 29, 2016, CN201610272153.0 filed Apr. 27, 2016, CN201610394610.3 filed Jun. 3, 2016, CN201610586388.7 filed Jul. 22, 2016, CN201610544049.2 filed Jul. 7, 2016 and CN201610936171.4 filed Nov. 1, 2016, and which is a continuation-in-part application of U.S. Ser. No. 15/237,983 filed Aug. 16, 2016, which claims priority to CN201510502630.3 filed Aug. 17, 2015, CN201510966906.3 filed Dec. 19, 2015, CN201610041667.5 filed Jan. 22, 2016, CN201610272153.0 filed Apr. 27, 2016, CN201610281600.9 filed Apr. 29, 2016, CN201610394610.3 filed Jun. 3, 2016 and CN201610586388.7 filed Jul. 22, 2016, each of which is incorporated herein by reference in its entirety.

FIELD OF THE INVENTION

The present invention relates to LED luminaries. More particularly, this invention describes an LED filament for LED light bulbs.

BACKGROUND OF THE INVENTION

Incandescent light bulbs are a source of electric light that creates light by running electricity through a resistive filament, thereby heating the filament to a very high temperature, so that it glows and produces visible light. Incandescent bulbs are made in a wide range of sizes and voltages, from 1.5 volts to about 300 volts. The bulbs consist of a generally glass or plastic enclosure with a filament of tungsten wire inside the bulb through which an electrical current is passed. Incandescent lamps are designed as direct "plug-in" components that mate with a lamp holder via a threaded Edison base connector (sometimes referred to as an "Edison base" in the context of an incandescent light bulb), a bayonet-type base connector (i.e., bayonet base in the case of an incandescent light bulb), or other standard base connector to receive standard electrical power (e.g., 120 volts A.C., 60 Hz in the United States, or 230V A.C., 50 Hz in Europe, or 12 or 24 or other D.C. voltage). The base provides electrical connections to the filament. Usually a stem or glass mount anchors to the base, allowing the electrical contacts to run through the envelope without gas or air leaks.

Incandescent light bulbs are widely used in household and commercial lighting, for portable lighting, such as table lamps, car headlamps, flashlights, and for decorative and advertising lighting. However, incandescent light bulbs are generally inefficient in terms of energy use and are subject to frequent replacement due to their limited lifetime (about 1,000 hours). Approximately 90% of the energy input is emitted as heat. These lamps are gradually being replaced by other, more efficient types of electric light such as fluorescent lamps, high-intensity discharge lamps, light emitting diodes (LEDs), etc. For the same energy input, these technologies give more visible light and generate much less heat. Particularly, LEDs consume a fraction of the energy used to illuminate incandescent bulbs and have a much longer lifetime (e.g. 50,000 to 75,000 hours). Furthermore, LED light sources are a very clean "green" light source and also provide good color reproduction.

LED light bulbs are far more efficient than traditional incandescent lamps, most notably because they use only a small fraction of the electricity of an incandescent. As traditional incandescent bulbs continue to be phased out, LED has become the mainstream light sources used on a variety of indoor and outdoor lighting fixtures. However, traditional LED light bulbs are not without its disadvantages, for example, the complicated designs which incorporate the heavy aluminum heat sinks and an electronic circuit for power conversion. Consequently, the cost is high and the shape is somewhat strange compared with the elegant incandescent bulbs people are accustomed to.

An LED filament bulb is a light bulb that uses LEDs as its filaments. Accordingly, it is desirable to provide a novel LED filament light bulb with improved performance and aesthetics that may be used as a better replacement for a typical incandescent light bulb than traditional LED light bulbs.

The LED has advantages of environmental protection, energy saving, high efficiency and long lifespan, and therefore it attracts widespread attention in recent years and gradually replaces traditional lighting lamps. However, due that the luminescence of the LED has directivity, current LED lamps is unable to provide with an illumination with a wide angle range like traditional lamps. Accordingly, how to design LED lamps with similar wide range of illumination to the traditional lamps challenges the industries.

Recently, an LED light bulb has been provided and gradually replaces the use of incandescent light bulbs. The kind of the LED light bulbs is provided with multiple LED filaments due to the limited illuminating angle of LED light sources. The LED filaments are aligned in a circle in the LED light bulb, and each of the LED filaments faces different angles for illumination, such that the illuminating angle of the LED light bulb could be increased in general. The manufacturing process of the LED filament includes: fixing multiple LED chips in series to a long, narrow glass substrate, enclosing the whole glass substrate by silicone gel mixed with phosphor powders, and processing electrical connection of the LED filament. When the LED filaments are welded to a stand in the LED light bulb, the LED filaments have to be welded one by one, which is numerous and complicated. Further, the LED filaments are welded in a spot welding manner, which requires high standard regarding property and size of materials, and has a risk of faulty welded joint. In appearance, the LED filaments are hard and straight and lack flexibility and variation. The conventional LED light bulb gives people nothing more than a visually stiff feeling and cannot provide an aesthetic appearance.

In addition, the color temperature of light generated by the LED filaments is usually too high such that the use of the LED filaments is only suitable for limited environments. In a comfort and relax occasion, using conventional tungsten filament bulbs with low color temperature of light for illumination is much better.

Further, the LED filaments generate a large amount of heat during operation. Heat may damage components in the LED light bulb such as LED chips and a driving circuit and lower the efficiency of the LED filaments.

OBJECTS AND SUMMARY OF THE INVENTION

It is an object of the claimed invention to provide an improved LED light bulb, which is easily manufactured, has a wide angle for illumination, and provides an aesthetic appearance.

In accordance with an embodiment with the present invention, an LED light bulb comprises a bulb shell, a bulb base, a stem, at least two conductive supports, an LED filament, and at least one supporting arm. The bulb base is connected to the bulb shell. The stem comprises a stem bottom and a stem top opposite to each other. The stem bottom is connected to the bulb base. The two conductive supports are connected to the stem. The LED filament comprises a filament body and two conductive electrodes. The two conductive electrodes are at two opposite ends of the filament body and are respectively connected to the two conductive supports. The filament body is around the stem. An end of the supporting arm is connected to the stem and another end is connected to the filament body. In a height direction of the LED light bulb, H is a distance from a bottom of the bulb shell to a top of the bulb shell. A first height difference is defined between the two conductive electrodes and is from 0 to $\frac{1}{10}$H. The filament body is curved and rises and falls to form a highest point and a lowest point. A second height difference is defined between the highest point and the lowest point. The first height difference is less than the second height difference, and the second height difference is from $\frac{2}{10}$H to $\frac{4}{10}$H.

In another embodiment, when the LED light bulb is projected to a side projection plane parallel with a height direction of the LED light bulb, a filament side projection of the filament body on the side projection plane comprises a highest point and a lowest point. A height difference is defined between the highest point and the lowest point in the height direction. The height difference is from $\frac{1}{8}$ to $\frac{3}{8}$ of a height of the bulb shell. When the LED light bulb is projected to a horizontal projection plane perpendicular to the height direction of the LED light bulb, a filament horizontal projection of the filament body on the horizontal projection plane is of a quasi-circle or a quasi U shape, and a shortest distance between the two ends of the filament horizontal projection is from 0 cm to 3 cm. In the height direction of the LED light bulb, a height difference between the two conductive electrodes is from 0 mm to 5 mm In another embodiment, the filament body comprises at least one first curving segment and at least two second curving segments. The first curving segment is between the two second curving segments. The two conductive electrodes are respectively at an end of each of the two second curving segments away from the first curving segment. A height difference between the two conductive electrodes in a height direction of the LED light bulb is from 0 mm to 5 mm. The first curving segment curves towards a first direction. The second curving segment curves towards a second direction. The first curving segment and the two second curving segments form a wave shaped annular structure.

According to the embodiments of the instant disclosure, the LED light bulb includes many advantages. For example, the manufacturing of the product is simplified, the angle of emitting light is wide, the color temperature of light could be easily adjusted, the strength of the filament is better, and the whole of the product has a better aesthetic appearance.

Various other objects, advantages and features of the present invention will become readily apparent from the ensuing detailed description, and the novel features will be particularly pointed out in the appended claims.

BRIEF DESCRIPTION OF FIGURES

The following detailed descriptions, given by way of example, and not intended to limit the present invention solely thereto, will be best be understood in conjunction with the accompanying figures.

DETAILED DESCRIPTION OF THE EMBODIMENTS

Figure 1:
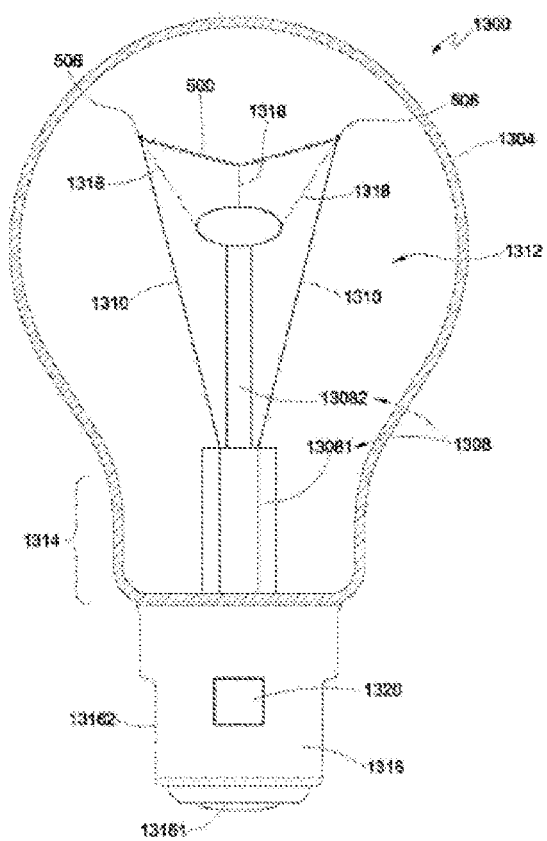
FIG. 1 is a front view of the LED light bulb in accordance with an embodiment of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element or layer is referred to as being "on," "connected to," "coupled to" or "responsive to" (and/or variants thereof) another element, it can be directly on or directly connected, coupled or responsive to the other element or intervening elements may be present. In contrast, when an element is referred to as being "directly on," "directly connected to," "directly coupled to" or "directly responsive to" (and/or variants thereof) another element, there are no intervening elements present. As used herein, the term "and/or" includes any and all combinations of one or more of the associated listed items and may be abbreviated as "/".

The terminology used herein is for purposes of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

The present invention is described below with reference to block diagrams and/or flowchart illustrations of methods and/or apparatus (systems) according to embodiments of the invention. It is understood that a block of the block diagrams and/or flowchart illustrations, and combinations of blocks in the block diagrams and/or flowchart illustrations, can embody apparatus/systems (structure), means (function) and/or steps (methods) for implementing the functions/acts specified in the block diagrams and/or flowchart block or blocks. It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

FIG. 1 shows an LED light bulb 1300 having an LED filament 1302 of the present invention as the light source. In an embodiment, the LED light bulb 1300 comprises a light transmissive envelope 1304, a base 1306, a stem press 1308, an LED filament 1302 and a plurality of lead wires 1310. The light transmissive envelope 1304 is a bulbous shell made from light transmissive materials such as glass and plastic. The light transmissive envelope 1304 includes a bulbous main chamber 1312 for housing the LED filament 1302 and sometimes a neck 1314 dimensionally adapted for attaching to the base 1306. At least part of the 1306 base is metal and includes a plurality of electrical contacts 1316 for receiving electrical power from a lampholder. The light transmissive envelope 1304 is mounted with its neck 1314 on the base 1306. The stem press 1308 is mounted on the base 1306 within the light transmissive envelope 1304 for holding the lead wire 1310 and the LED filament 1302 in position while keeping the positive and negative currents insulated from each other. The lead wire 1310 extends in a substantially axial direction from the base 1306 through the neck 1314 all the way into the main chamber 1312. The lead wire 1310 physically and electrically connects the electrical contact 1316 of the base 1306 and an electrical connector 506 of the LED filament. Electrical power is communicated from the lampholder to the base 1306 and all the way to the LED filament 1302 through the lead wire 1310 when the base 1306 and the lampholder are properly connected. The LED light bulb 1300 is thus configured to emit light omni-directionally. In some embodiments, the LED light bulb 1300, including exactly one LED filament 1302, is configured to emit light omnidirectionally. In other embodiments, the LED light bulb 1300, including a plurality of LED filaments 1302, is configured to emit light omnidirectionally. In addition to brining electrical power for the LED filament 1302, the lead wire 1310 also supports the LED filament 1302 to main a desired posture in the main chamber 1312.

In some embodiment where the lead wire 1310 alone do not provide sufficient support, the LED light bulb 1300 further includes a plurality of support wires 1318 to help the LED filament 1302 maintain a desired posture in the main chamber 1312. In some embodiments, the support wire 1318 is made of carbon spring steel for additional damping protection. Preferably, the support wire 1318 is not in electrical communication with any part of the LED light bulb 1300. Thus, negative impact resulting from thermal expansion or heat is mitigated. When the LED filament 1302 defines a sinuous curve in the main chamber 1312, the lead wire 1310 supports the LED filament 1302 either at the crest of the curve, the trough of the curve or anywhere between the crest and the trough. The support wire 1318 attaches to the LED filament 1302 in a variety of ways. For example, the lead wire 1310 includes a hook or claw at a tip. The throat of the hook is snugly closed around the LED filament. Alternatively, the claw is snugly closed around the LED filament.

In an embodiment, the LED light bulb include exactly two lead wires 1310. The base includes a top end, a bottom end and a side surface. The light transmissive envelope 1304 is mounted with its neck 1314 on the top end of the base 1306. The base 1306 includes a foot electrical contract 1316 at the bottom end and a base electrical contact 1316 on the side surface. A first lead wire 1310 physically and electrically connects the foot electrical contact 1316 and a first electrical connector 506f of the LED filament 1302. A second lead wire 1310 physically and electrically connects the base electrical contact 1316 and a second electrical connector 506s of the LED filament 1302. For example, the lead wire 1310 and the electrical contact 506 is fastened together by soldering. The filler metal includes gold, silver, silver-based alloy or tin. Alternatively, when the electrical connector 506 includes an aperture and the lead wire 1310 includes a hook structure at a tip, the lead wire 1310 and the electrical connector 506 is fastened by closing the throat of the hook against the aperture. In some embodiments, the LED light bulb 1300 further includes a rectifier 1320, which is in electrical connection with the electrical contact 1316 of the base 1306 and the lead wire 1310, for converting AC electricity from the lampholder into DC electricity to drive the LED filament 1302.

Preferably, the base 1306 has a form factor compatible with industry standard light bulb lamp holder. Specifications for light bulb bases and sockets largely overseen by two organizations. The American National Standards Institute (ANSI) is an organization that publishes C81.61 and C81.62, while International Electro technical Commission (IEC) publishes 60061-1 and 60061-2. Edison screw lamp base and lampholder examples include but are not limited to the E-series described in ANSI C81.61 and C81.62: E5 midget, E10 miniature, E11 mini-candelabra, E12 candelabra, E17 intermediate, E26/24 single-contact medium, E26d double-contact medium, E26/50x39 skirted medium, E26/53x39 extended skirted medium, E29/53x39 extended skirted admedium, E39 single-contact mogul, E39d double-contact mogul, EP39 position-oriented mogul, and EX39 exclusionary mogul. Multiple-pin lamp base and lampholder examples include but are not limited to the G-series described in ANSI C81.61 and C81.62: GY two-pin for T, G4 two-pin for single-ended TH, GU4 two-pin for MR11 GLS lamps, GZ4 two-pin for projection lamps, G5 fluorescent miniature two-pin, 2G7 four-pin compact fluorescent, GZ10 bipin, G16t three-contact lug for PAR lamps, G17t three-pin prefocus for incandescent projection lamps. Bayonet lamp base and lampholder examples include but are not limited to the B-series described in ANSI C81.61 and C81.62: B/BX8.4d small instrument panel, BA9/12.5 miniature, BAW9s for HY21 W, BA15s candelabra single contact, BAZ15d double contact with offset, and BY22d multipurpose sleeved double contact.

In an embodiment, the light transmissive envelope 1304 is made from a light transmissive material with good thermal conductively, e.g. glass, plastic. In another embodiment, the light transmissive envelope 1304 is configured to absorb a portion of the blue light emitted by the LED filament to obtain a warmer color temperature. To make the light warmer, for example, the light transmissive envelope 1304 is made from a material doped with yellow particles. Alternatively, the light transmissive envelope is coated with a yellow film. In yet another embodiment, the light transmissive envelope 1304, which is hermetically connected to the base 1306, is charged with a gas having greater thermal conductivity than the air such as hydrogen, nitrogen and a mixture of both. In additional to greater heat dissipation, humidity, potentially undermining the electronics of the LED light bulb 1300, is thus removed from the light transmissive envelope 1304. In an embodiment, hydrogen accounts for from 5% to 50% of the volume of the light transmissive envelope 1304. In still another embodiment, the light transmissive envelope 1304 is sealed at an internal pressure of from 0.4 to 1.0 ATM.

The stem press 1308 is made from an electrically insulative material such as glass or plastic. The shape and dimension of the stem press 1308 depends a totality of considerations such as the number of LED filaments 1302 the LED light bulb 1300 has, the posture the LED filament 1302 is expected to maintain in the main chamber 1312; the manner the lead wire 1310 supports the LED filament 1302; the number of lead wires 1310 the LED light bulb 1300 has; whether the LED light bulb 1300 further includes support wires 1318; and whether or how a heatsink finds itself in the LED light bulb. In an embodiment, the stem press 1308 extends barely above the base. In another embodiment, the stem press extends above the base 1306 and into the neck 1314. In yet another embodiment, the stem press 1308 extends above the base 1306, through the neck 1314 and into the main chamber 1312. In some embodiments, the stem press 1308 is made from an electrically insulative material have good thermal conductivity such as aluminium oxide and aluminium nitride. In other embodiments, the stem press 1308 includes an opening for evacuating the air from the light transmissive envelope 1304 and for charging the light transmissive envelope 1304 with the desired amount of gas.

Figure 4A:
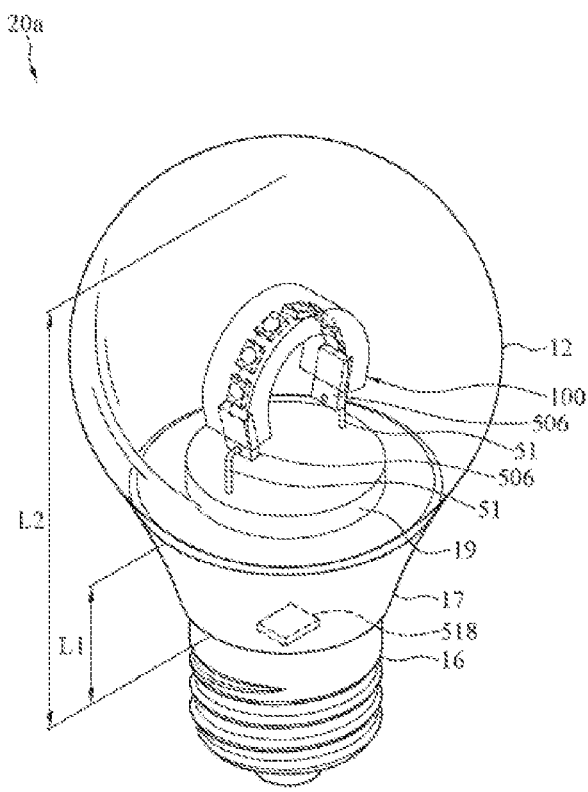
FIGS. 4A and 4B illustrate a perspective view of an LED light bulb according to a first and a second embodiments of the present disclosure.

The LED filament is designed to maintain a posture within the chamber to obtain an omnidirectional light emission. In FIG. 4A, the LED light bulb comprises a light transmissive envelope, a base, a stem press, exactly one LED filament, exactly a pair of lead wires, a heatsink and a rectifier. The heatsink is disposed between the light transmissive envelope and the base. The rectifier is disposed within the heatsink. The stem press includes a stump-like structure projecting from the base. The LED filament defines an arc extending substantially vertically in the light transmissive envelope. For easy reference, a Cartesian coordinate system is oriented for the LED light bulb where: (1) the interface connecting the light transmissive envelope and heatsink falls on the x-y plane; and (2) the z-axis, also the central axis of the LED light bulb, intersects the interface at point O. In the embodiment, the end point of the arc reaches as high as point H1 on the y-axis. The distance between the end points of the LED filament on the x-y plane is D. The length of LED filament on the y-axis is A. The posture of the LED filament in the LED light bulb is defined by all points in the set (0, y, z+H1), where z goes up from 0 to A and then from A back to 0 as y goes from −D/2 to 0 and then from 0 to D/2. The length of the heatsink along the z-axis is L1. The length of the combination of the light transmissive envelope and the heatsink along the z-axis is L2. The greater the ratio L1/L2 is, the LED light bulb is configured to have a better heat dissipation but potentially compromised filed of angle when the LED filament is elevated to a higher position within the light transmissive envelope. Preferably, the ratio L1/L2 is from 1/30 to 1/3.

Figure 4B:
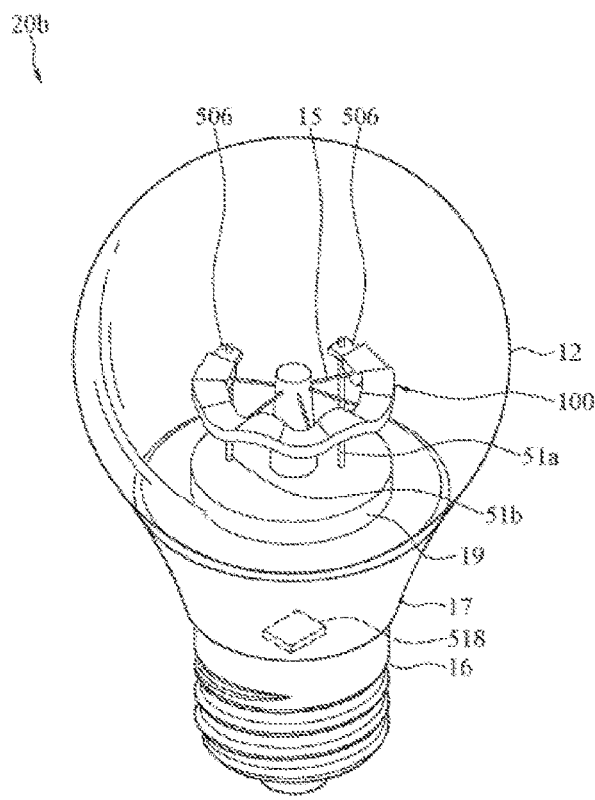

In FIG. 4B, the LED light bulb comprises a light transmissive envelope, a base, a stem press, exactly one LED filament, exactly a pair of lead wires, a heatsink, a rectifier and a plurality of support wires. The heatsink is disposed between the light transmissive envelope and the base. The rectifier is disposed within the heatsink. The stem press further includes a post portion for elevating the LED filament to a desired position in the light transmissive envelope. The plurality of support wires radiate (horizontally, for example) from the post portion to form a spoke-and-hub structure in the light transmissive envelope. The support wire is attached to the post portion at a first end and to the LED filament at a second end. In the embodiment, the LED filament defines a sinuous curve along an arc meandering substantially horizontally in the light transmissive envelope. The sinuous curve oscillates in the range from H1+A1 to H1−A1 on the y-axis, where H1 represents the average height of the LED filament in the LED light bulb and A1 the amplitude of the sinuous curve the LED filament defines. The plurality of support wires have a same length R. The posture of the LED filament in the LED light bulb is defined by all points in the set (x, y, z+H1), where −R=<x=<R; −R=<y=<R; and −A1=<z=<A1. The LED filament, seen through the light transmissive envelope, is aesthetically pleasing when it is glowing or not. Moreover, omnidirectional light emission is made possible with only one LED filament having a posture like this. The quality as well the cost for producing omnidirectional LED light bulbs is thus improved because fewer interconnections of parts are needed when only one LED filament is involved.

Figure 5A:
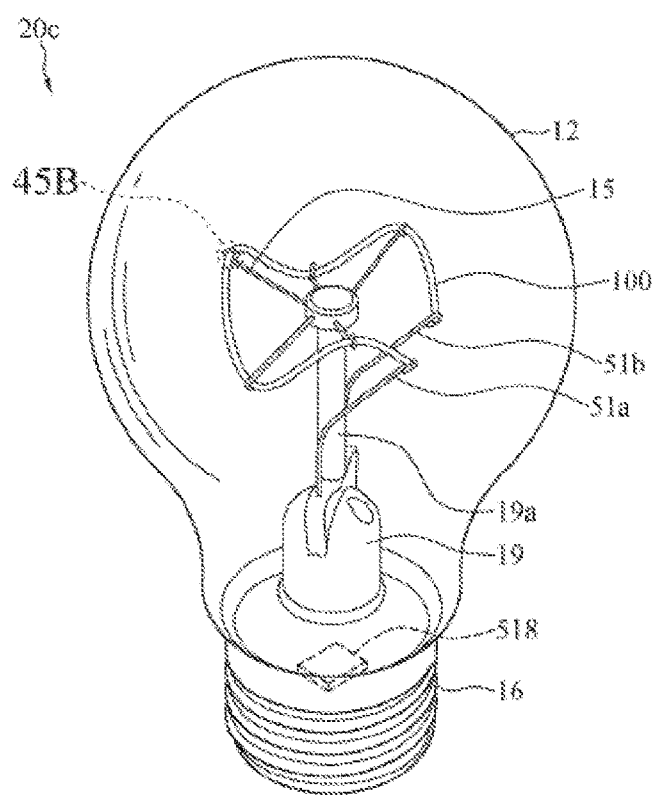
FIG. 5A illustrates a perspective view of an LED light bulb according to a third embodiment of the present disclosure.

In FIG. 5A, the LED light bulb comprises a light transmissive envelope, a base, a stem press, exactly one LED filament, exactly a pair of lead wires, a rectifier and a plurality of support wires. The light transmissive envelope has a bulbous main chamber for housing the LED filament and a neck for connecting the light transmissive envelope to the base. The rectifier is disposed within the base. The plurality of support wires radiate (slightly deviating from the horizon, for example) from the post portion to form a spoke-and-hub structure in the light transmissive envelope. The support wire is attached to the post portion at a first end and to the LED filament at a second end. In the embodiment, the LED filament defines a sinuous curve along an arc meandering substantially horizontally in the light transmissive envelope. The sinuous curve oscillates in the range from H2+A2 to H2−A2 on the y-axis, where H2 represents the average height of the LED filament in the LED light bulb and A2 the amplitude of the sinuous curve the LED filament defines. A2 is greater than A1; likewise, H2 is greater than H1. Consequently, the stem press in FIGS. 4A and 4B is a shorter structure projecting from projecting from the base. By contrast, the stem press we need in FIG. 5A to elevate the LED filament to a higher position in the main chamber becomes a longer structure having, for example, a basal portion and an elongated post portion. The plurality of support wires have a same length R. The posture of the LED filament in the LED light bulb is defined by all points in the set (x, y, z+H2), where −R=<x=<R; −R=<y=<R; and −A2=<z=<A2.

Figure 6A:
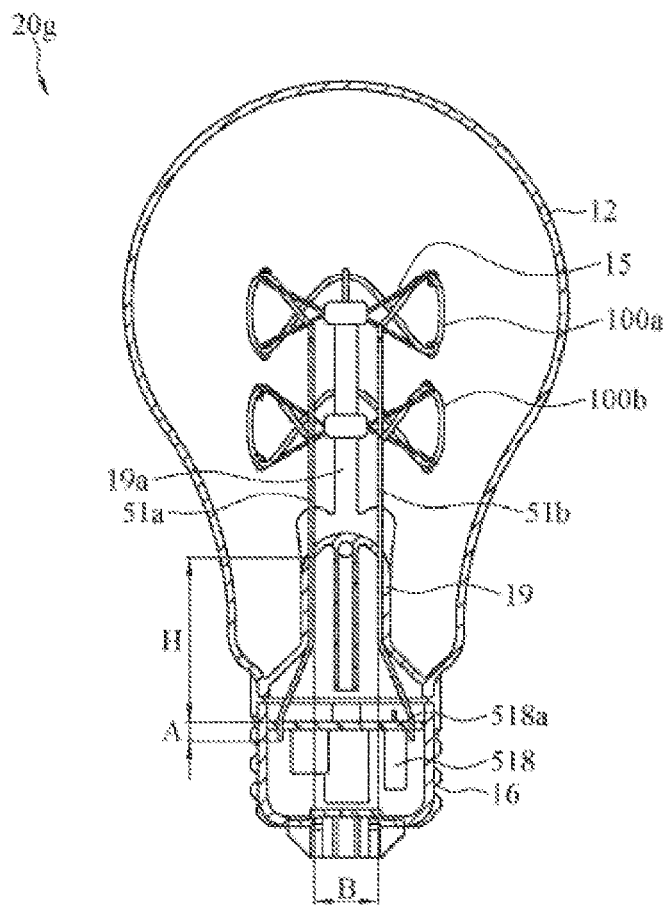
FIG. 6A illustrates a cross-sectional view of an LED light bulb according to a fourth embodiment of the present disclosure.

In FIG. 6A, the LED light bulb comprises a light transmissive envelope, a base, a stem press, an upper LED filaments, a lower LED filament, an upper set of lead wires, a lower set of lead wire, a rectifier and exactly two sets of support wires. The light transmissive envelope has a bulbous main chamber for housing the LED filament and a neck for connecting the light transmissive envelope to the base. The rectifier is disposed within the base. The set of support wires radiate (slightly deviating from the horizon, for example) from the post portion to form a spoke-and-hub structure in the light transmissive envelope. The support wire is attached to the post portion at a first end and to the LED filament at a second end. The upper set of support wires is configured to hold the upper LED filament in position. The lower set of support wires is configured to hold the lower LED filament in position. Other things equal, a shorter LED filament is needed to produce the same luminosity of omnidirectional light with the LED light bulb in FIG. 6A than the LED light bulb in FIG. 5A. Likewise, the LED light bulb in FIG. 6A is amenable to a smaller girth than the LED light bulb in FIG. 5A. In the embodiment, the LED filament defines a sinuous curve along an arc meandering substantially horizontally in the light transmissive envelope. The higher LED filament defines a higher sinuous curve oscillating in the range from H3+A3 to H3−A3 on the y-axis, where H3 represents the average height of the higher LED filament in the LED light bulb and A3 the amplitude of the first sinuous curve the higher LED filament defines. The lower LED filament defines a lower sinuous curve oscillating in the range from H4+A3 to H4−A3 on the y-axis, where H4 represents the average height of the lower LED filament in the LED light bulb and A3 the amplitude of the lower sinuous curve the lower LED filament defines. H4 is less than H3 on the y-axis, making one LED filament higher in the light transmissive envelope than the other one. A3 is chosen to be, for example, the same as that of the higher sinuous curve. The plurality of support wires have a same length R. The posture of the higher LED filament in the LED light bulb is defined by all points in the set (x, y, z+H3), where −R=<x=<R; −R=<y=<R; and −A3=<z=<A3. The posture of the lower LED filament in the LED light bulb is defined by all points in the set (x, y, z+H4), where −R=<x=<R; −R=<y=<R; and −A3=<z=<A3.

In the embodiment in FIG. 6A, the rectifier, which is disposed in the base, includes a circuit board in electrical communication with the lead wire. The pair of lead wires are parallelly spaced apart from each other. The upper portion of the lead wire is attached to the pair of LED filaments. The intermediate portion of the lead wire is fixedly attached to the basal portion of the stem press by passing through the basal portion. The lower portion of the lead wire is fixedly attached to the rectifier. In an embodiment, the circuit board includes an L-shaped aperture cut into the circumference of the circuit board. The lead wire includes a hook at the tip. The hook is configured to interlock the aperture for reliable soldering between the lead wire and the circuit board. The lead wire has a proper length for connecting the circuit board and the LED filament. In an embodiment, for purposes of safety, the lead wire has a length determined by D (mm). D=A+√(B−3.2)^2+C^2), where 3.2 is the electricity safety spacing; A is the aggregate of the thickness of the circuit board and the length of the lead wire projecting downwards from the circuit board; B is the distance between the pair of lead wires; and C is distance from the entry point of the lead wire into the basal portion to the entry point of lead wire into the circuit board. Preferably, the length of the lead wire we need to reach the lower LED filament (L1) is from 0.5 D to 2D. Most preferably, L1 is from 0.75 D to 1.5 D. The length of the lead wire we need to reach the upper LED filament (L2) is L1+(H3−H4).

In some embodiments, a layer of reflective materials, e.g. white paint, is coated to the support wire, the stem press, the upper surface of the base in the light transmissive envelope or any combination of the above for directing light outwards. In other embodiments, a layer of graphene, which has good thermal conductivity, is coated to the support wire, the stem press, the upper surface of the base in the light transmissive envelope or any combination of the above for better heat dissipation.

Figure 2:
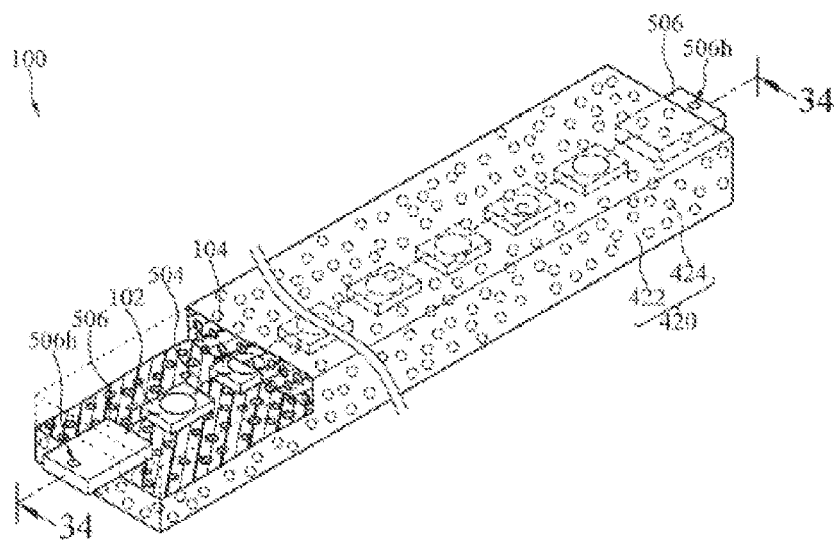
FIG. 2 illustrates a perspective view of an LED light bulb with partial sectional view according to a first embodiment of the LED filament.
Figure 3:
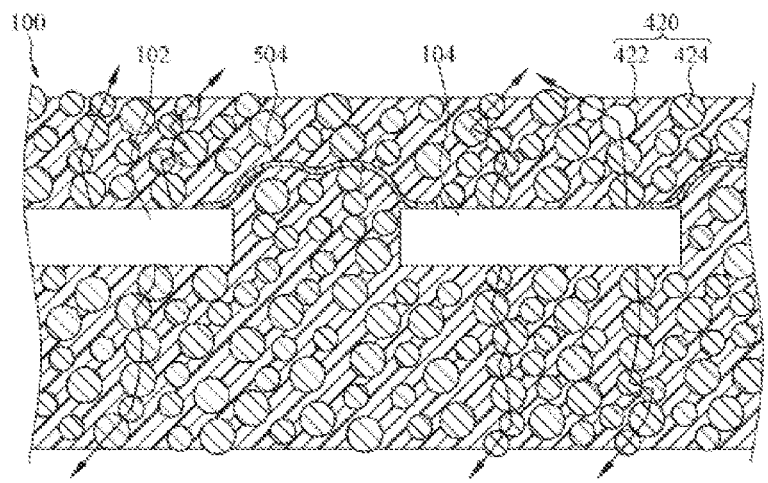
FIG. 3 illustrates a partial cross-sectional view at section 34-34 of FIG. 2.

Please refer to FIGS. 2 and 3. FIG. 2 illustrates a perspective view of an LED filament with partial sectional view according to a first embodiment of the present disclosure while FIG. 3 illustrates a partial cross-sectional view at section 34-34 of FIG. 2. According to the first embodiment, the LED filament 100 comprises a plurality of LED chips 102, 104, at least two conductive electrodes 506, and a light conversion coating 420. The conductive electrodes 506 are disposed corresponding to the plurality of LED chips 102, 104. The LED chips 102, 104 are electrically coupled together. The conductive electrodes 506 are electrically connected with the plurality of LED chips 102, 104. The light conversion coating 420 coats on at least two sides of the LED chips 102, 104 and the conductive electrodes 506. The light conversion coating 420 exposes a portion of two of the conductive electrodes 506. The light conversion coating 420 comprises an adhesive 422 and a plurality of phosphors 424.

LED filament 100 emits light while the conductive electrodes 506 are applied with electrical power (electrical current sources or electrical voltage sources). In this embodiment, the light emitted from the LED filament 100 is substantially close to 360 degrees light like that from a point light source. An LED light bulb 20a, 20b, illustrated is in FIGS. 4A and 4B, utilizing the LED filament 100 is capable of emitting omnidirectional light, which will be described in detailed in the followings.

As illustrated in the FIG. 2, the cross-sectional outline of the LED filament 100 is rectangular. However, the cross-sectional outline of the LED filament 100 is not limited to rectangular, but may be triangle, circle, ellipse, square, diamond, or square with chamfers.

Each of LED chips 102, 104 may comprise a single LED die or a plurality of LED dies. The outline of the LED chip 102, 104 may be, but not limited to, a strip shape. The number of the LED chips 102, 104 having strip shapes of the LED filament 100 could be less, and, correspondingly the number of the electrodes of the LED chips 102, 104 is less, which can improve the illuminating efficiency since the electrodes may shield the illumination of the LED chip, thereby affecting the illumination efficiency. In addition, the LED chips 102, 104 may be coated on their surfaces with a conductive and transparent layer of Indium Tin Oxide (ITO). The metal oxide layer contributes to uniform distribution of the current diffusion and to increase of illumination efficiency. Specifically, the aspect ratio of the LED chip may be 2:1 to 10:1; for example, but not limited to, 14×28 or 10×20. Further, the LED chips 102, 104 may be high power LED dies and are operated at low electrical current to provide sufficient illumination but less heat.

The LED chips 102, 104 may comprise sapphire substrate or transparent substrate. Consequently, the substrates of the LED chips 102, 104 do not shield/block light emitted from the LED chips 102, 104. In other words, the LED chips 102, 104 are capable of emitting light from each side of the LED chips 102, 104.

The electrical connections among the plurality of LED chips 102, 104 and the conductive electrodes 506, in this embodiment, may be shown in FIG. 2. The LED chips 102, 104 are connected in series and the conductive electrodes 506 are disposed on and electrically and respectively connected with the two ends of the series-connected LED chips 102, 104. However, the connections between the LED chips 102, 104 are not limited to that in FIG. 2. Alternatively, the connections may be that two adjacent LED chips 102, 104 are connected in parallel and then the parallel-connected pairs are connected in series.

Please further refer to FIG. 4A. The conductive electrodes 506 has through holes 506h (shown in FIG. 2) on the exposed portion for being connected with the conductive supports 51a, 51b of the LED light bulb 20a.

Please refer to FIGS. 2 and 3 again. According to this embodiment, the LED filament 100 further comprises conductive wires 540 for electrically connecting the adjacent LED chips 102, 104 and conductive electrodes 506. The conductive wires 540 may be gold wires formed by a wire bond of the LED package process, like Q-type. According to FIG. 3, the conductive wires 540 are of M shape. The M shape here is not to describe that the shape of the conductive wires 540 exactly looks like letter M, but to describe a shape which prevents the wires from being tight and provides buffers when the conductive wires 540 or the LED filament 100 is stretched or bended. Specifically, the M shape may be any shape formed by a conductive wire 540 whose length is longer than the length of a wire which naturally arched between two adjacent LED chips 102, 104. The M shape includes any shape which could provide buffers while the conductive wires 104 are bended or stretched; for example, S shape.

As mention above, the Young's Modulus (Y) of the LED filament 100 may be between $0.1 \times 10^{10}$ to $0.3 \times 10^{10}$ Pa. If necessary, the Young's Modulus of the LED filament 100 may be between $0.15 \times 10^{10}$ to $0.25 \times 10^{10}$ Pa. Consequently, the LED filament 100 would not be easily broken and still possess adequate rigidity and deflection.

Please refer to FIGS. 4A and 4B which illustrate a perspective view of LED light bulb applying the LED filaments according to a first and a second embodiments. The LED light bulb 20a, 20b comprises a bulb shell 12, a bulb base 16 connected with the bulb shell 12, at least two conductive supports 51a, 51b disposed in the bulb shell 12, a driving circuit 518 electrically connected with both the conductive supports 51a, 51b and the bulb base 16, and a single LED filament 100 disposed in the bulb shell 12.

The conductive supports 51a, 51b are used for electrically connecting with the conductive electrodes 506 and for supporting the weight of the LED filament 100. The bulb base 16 is used to receive electrical power. The driving circuit 518 receives the power from the bulb base 16 and drives the LED filament 100 to emit light. Due that the LED filament 100 emits light like the way a point light source does, the LED light bulb 20a, 20b may emit omnidirectional light. In this embodiment, the driving circuit 518 is disposed inside the LED light bulb. However, in some embodiments, the driving circuit 518 may be disposed outside the LED bulb.

The definition of the omnidirectional light depends upon the area the bulb is used and varies over time. The definition of the omnidirectional light may be, but not limited to, the following example. Page 24 of Eligibility Criteria version 1.0 of US Energy Star Program Requirements for Lamps (Light Bulbs) defines omnidirectional lamp in base-up position requires that light emitted from the zone of 135 degree to 180 degree should be at least 5% of total flux (lm), and 90% of the measured intensity values may vary by no more than 25% from the average of all measured values in all planes (luminous intensity (cd) is measured within each vertical plane at a 5 degree vertical angle increment (maximum) from 0 degree to 135 degree). JEL 801 of Japan regulates the flux from the zone within 120 degrees along the light axis should be not less than 70% of total flux of the bulb.

In the embodiment of FIG. 4A, the LED light bulb 20a comprises two conductive supports 51a, 51b. In an embodiment, the LED light bulb may comprise more than two conductive supports 51a, 51b depending upon the design.

The bulb shell 12 may be shell having better light transmittance and thermal conductivity; for example, but not limited to, glass or plastic shell. Considering a requirement of low color temperature light bulb on the market, the interior of the bulb shell 12 may be appropriately doped with a golden yellow material or a surface inside the bulb shell 12 may be plated a golden yellow thin film for appropriately absorbing a trace of blue light emitted by a part of the LED chips 102, 104, so as to downgrade the color temperature performance of the LED bulb 20a, 20b. A vacuum pump may swap the air as the nitrogen gas or a mixture of nitrogen gas and helium gas in an appropriate proportion in the interior of the bulb shell 12, so as to improve the thermal conductivity of the gas inside the bulb shell 12 and also remove the water mist in the air. The air filled within the bulb shell 12 may be at least one selected from the group substantially consisting of helium (He), and hydrogen (H2). The volume ratio of Hydrogen to the overall volume of the bulb shell 12 is from 5% to 50%. The air pressure inside the bulb shell may be 0.4 to 1.0 atm (atmosphere).

According to the embodiments of FIGS. 4A and 4B, each of the LED light bulbs 20a, 20b comprises a stem 19 in the bulb shell 12 and a heat dissipating element (i.e. heat sink) 17 between the bulb shell 12 and the bulb base 16. In the embodiment, the bulb base 16 is indirectly connected with the bulb shell 12 via the heat dissipating element 17. Alternatively, the bulb base 16 can be directly connected with the bulb shell 12 without the heat dissipating element 17. The LED filament 100 is connected with the stem 19 through the conductive supports 51a, 51b. The stem 19 may be used to swap the air inside the bulb shell 12 with nitrogen gas or a mixture of nitrogen gas and helium gas. The stem 19 may further provide heat conduction effect from the LED filament 100 to outside of the bulb shell 12. The heat dissipating element 17 may be a hollow cylinder surrounding the opening of the bulb shell 12, and the interior of the heat dissipating element 17 may be equipped with the driving circuit 518. The exterior of the heat dissipating element 17 contacts outside gas for thermal conduction. The material of the heat dissipating element 17 may be at least one selected from a metal, a ceramic, and a plastic with a good thermal conductivity effect. The heat dissipating element 17 and the stem 19 may be integrally formed in one piece to obtain better thermal conductivity in comparison with the traditional LED light bulb whose thermal resistance is increased due that the screw of the bulb base is glued with the heat dissipating element.

Referring to FIG. 4A, the height of the heat dissipating element 17 is L1 and the height from the bottom of the heat dissipating element 17 to the top of the bulb shell 12 is L2. The ratio of L1 to L2 is from 1/30 to 1/3. The lower the ratio, the higher the cutoff angle of illumination of the light bulb. In other words, the lower ratio increases the higher light-emission angle and the light from the bulb is closer to omnidirectional light.

Please referring to FIG. 4B, the LED filament 100 is bent to form a portion of a contour and to form a wave shape having wave crests and wave troughs. In the embodiment, the outline of the LED filament 100 is a circle when being observed in a top view and the LED filament 100 has the wave shape when being observed in a side view. Alternatively, the outline of the LED filament 100 can be a wave shape or a petal shape when being observed in a top view and the LED filament 100 can have the wave shape or a line shape when being observed in a side view. In order to appropriately support the LED filament 100, the LED light bulb 20b further comprises a plurality of supporting arms 15 which are connected with and supports the LED filament 100. The supporting arms 15 may be connected with the wave crest and wave trough of the waved shaped LED filament 100. In this embodiment, the arc formed by the filament 100 is around 270 degrees. However, in other embodiment, the arc formed by the filament 100 may be approximately 360 degrees. Alternatively, one LED light bulb 20b may comprise two LED filaments 100 or more. For example, one LED light bulb 20b may comprise two LED filaments 100 and each of the LED filaments 100 is bent to form approximately 180 degrees arc (semicircle). Two semicircle LED filaments 100 are disposed together to form an approximately 360 circle. By the way of adjusting the arc formed by the LED filament 100, the LED filament 100 may provide with omnidirectional light. Further, the structure of one-piece filament simplifies the manufacturing and assembly procedures and reduces the overall cost.

In some embodiment, the supporting arm 15 and the stem 19 may be coated with high reflective materials, for example, a material with white color. Taking heat dissipating characteristics into consideration, the high reflective materials may be a material having good absorption for heat radiation like graphene. Specifically, the supporting arm 15 and the stem 19 may be coated with a thin film of graphene.

Please refer to FIG. 5A and FIG. 6A. FIG. 5A illustrates a perspective view of an LED light bulb according to a third embodiment of the present disclosure. FIG. 6A illustrates a cross-sectional view of an LED light bulb according to a fourth embodiment of the present disclosure. According to the third embodiment, the LED light bulb 20c comprises a bulb shell 12, a bulb base 16 connected with the bulb shell 12, two conductive supports 51a, 51b disposed in the bulb shell 12, a driving circuit 518 electrically connected with both the conductive supports 51a, 51b and the bulb base 16, a stem 19, supporting arms 15 and a single LED filament 100. The LED light bulb 20d of the fourth embodiment is similar to the third embodiment illustrated in FIG. 5A and comprises two LED filaments 100a, 100b arranged at the different vertical level in FIG. 6A. The LED filaments 100a, 100b are bent to form a contour from the top view of FIG. 6A.

The cross-sectional size of the LED filaments 100, 100a, 100b is small than that in the embodiments of FIGS. 4A and 4B. The conductive electrodes 506 of the LED filaments 100, 100a, 100b are electrically connected with the conductive supports 51a, 51b to receive the electrical power from the driving circuit 518. The connection between the conductive supports 51a, 51b and the conductive electrodes 506 may be a mechanical pressed connection or soldering connection. The mechanical connection may be formed by firstly passing the conductive supports 51a, 51b through the through holes 506h (shown in FIG. 2 and secondly bending the free end of the conductive supports 51a, 51b to grip the conductive electrodes 506. The soldering connection may be done by a soldering process with a silver-based alloy, a silver solder, a tin solder.

Similar to the first and second embodiments shown in FIGS. 4A and 4B, each of the LED filaments 100, 100a, 100b shown in FIG. 5A/6A is bent to form a contour from the top view of FIGS. 5A and 6A. In the embodiments of FIGS. 5A, 6A, each of the LED filaments 100, 100a, 100b is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

The stem 19 has a stand 19a extending to the center of the bulb shell 12. The stand 19a supports the supporting arms 15. The first end of each of the supporting arms 15 is connected with the stand 19a while the second end of each of the supporting arms 15 is connected with the LED filament 100, 100a, 100b. Please refer to FIG. 5B which illustrates an enlarged cross-sectional view of the dashed-line circle of FIG. 5A. The second end of each of the supporting arms 15 has a clamping portion 15a which clamps the body of the LED filament 100, 100a, 100b. The clamping portion 15a may, but not limited to, clamp at either the wave crest or the wave trough. Alternatively, the clamping portion 15a may clamp at the portion between the wave crest and the wave trough. The shape of the clamping portion 15a may be tightly fitted with the outer shape of the cross-section of the LED filament 100, 100a, 100b. The dimension of the inner shape (through hole) of the clamping portion 15a may be a little bit smaller than the outer shape of the cross-section of the LED filament 100, 100a, 100b. During manufacturing process, the LED filament 100, 100a, 100b may be passed through the inner shape of the clamping portion 15a to form a tight fit. Alternatively, the clamping portion 15a may be formed by a bending process. Specifically, the LED filament 100, 100a, 100b may be placed on the second end of the supporting arm 15 and a clamping tooling is used to bend the second end into the clamping portion to clamp the LED filament 100, 100a, 100b.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19a extending to the center of the bulb shell 12 and the supporting arms 15 are connected to a portion of the stand 19a near the top thereof, the position of the LED filaments 100 is at the level close to the center of the bulb shell 12. Accordingly, the illumination characteristics of the LED light bulb 20c are close to that of the traditional light bulb including illumination brightness. The illumination uniformity of LED light bulb 20c is better. In the embodiment, at least a half of the LED filaments 100 is around a center axle of the LED light bulb 20c. The center axle is coaxial with the axle of the stand 19a.

In the embodiment, the first end of the supporting arm 15 is connected with the stand 19a of the stem 19. The clamping portion of the second end of the supporting arm 15 is connected with the outer insulation surface of the LED filaments 100, 100a, 100b such that the supporting arms 15 are not used as connections for electrical power transmission. In an embodiment where the stem 19 is made of glass, the stem 19 would not be cracked or exploded because of the thermal expansion of the supporting arms 15 of the LED light bulb 20c. Additionally, there may be no stand in an LED light bulb. The supporting arm 15 may be fixed to the stem or the bulb shell directly to eliminate the negative effect to illumination caused by the stand.

The supporting arm 15 is thus non-conductive to avoid a risk that the glass stem 19 may crack due to the thermal expansion and contraction of the metal filament in the supporting arm 15 under the circumstances that the supporting arm 15 is conductive and generates heat when current passes through the supporting arm 15.

In different embodiments, the second end of the supporting arm 15 may be directly inserted inside the LED filament 100 and become an auxiliary piece in the LED filament 100, which can enhance the mechanical strength of the LED filament 100. Relative embodiments are described later.

Figure 5B:
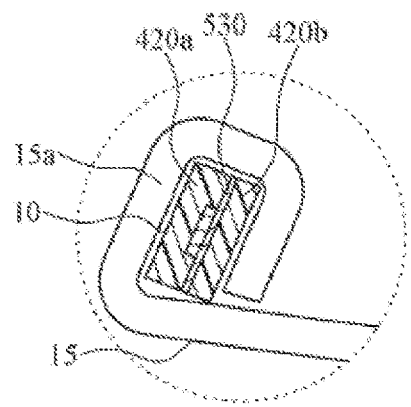
FIG. 5B illustrates an enlarged cross-sectional view of the dashed-line circle of FIG. 5A.

Since the inner shape (shape of through hole) of the clamping portion 15a fits the outer shape of the cross-section of the LED filament 100, the orientation of the cross-section of the LED filament 100, if necessary, may be properly adjusted. As shown in FIG. 5B, the top layer 420a is fixed to face around ten o'clock direction such that illumination surfaces of the LED filament 100 are facing substantially the same direction.

Figure 6B:
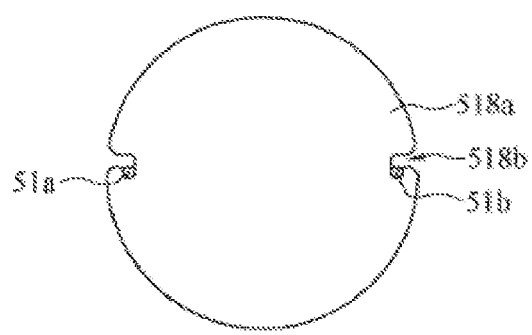
FIG. 6B illustrates the circuit board of the driving circuit of the LED light bulb according to the fourth embodiment of the present disclosure.

Please refer to FIG. 6B which illustrates the circuit board of the driving circuit of the LED light bulb from the top view of FIG. 6A according to the fourth embodiment of the present disclosure. The driving circuit 518 comprises a circuit board 518a which is fixed to the bulb base 16. The conductive supports 51a, 51b are electrically connected with the circuit board 518a and passes through the stand 19a to be electrically connected with the conductive electrodes 506 of the LED filament 100a, 100b. The circuit board 518a comprises notches 518b. The notches 518b are of hook shape. The size of the tip of the notches 518b is slightly smaller than that of the cross-section of the conductive supports 51a, 51b for fixing the conductive supports 51a, 51b. The tip of the notches 518b is beneficial to the soldering between the circuit board 518a and the conductive supports 51a, 51b.

In the embodiments of FIGS. 5A and 6A, the length of the conductive supports 51a, 51b is better to meet the below equation to prevent two conductive supports 51a, 51b from short circuit or to prevent the conductive supports 51a, 51b from unable to reach the circuit board 518a.

$$L = A + \sqrt{[(B-3.2)]^2 + H^2}$$

Wherein, referring to FIG. 6A, 3.2 is the electricity safety spacing; L is the calculated length of the conductive supports 51a, 51b and its unit is mini-meter; A is the sum of the thickness of the circuit board 518a and the height of the portion of the conductive supports 51a, 51b exposed from the surface of the circuit board 518a; B is the horizontal distance between the two conductive supports 51a, 51b; and H is the height from the circuit board 518a to the point the conductive supports 51a, 51b enters the stem 19. The actual length of the conductive supports 51a, 51b may be, but not limited to, between 0.5 L and 2 L, and more particularly between 0.75 L and 1.5 L.

In the embodiment of FIG. 6A, the LED light bulb 20d has two LED filaments 100a, 100b disposed on different vertical levels. The conductive supports 51a, 51b for the upper LED filaments 100a has a length Z=L+Y. Y is the distance between the upper LED filament 100a and the lower LED filament 100b.

Figure 5C:
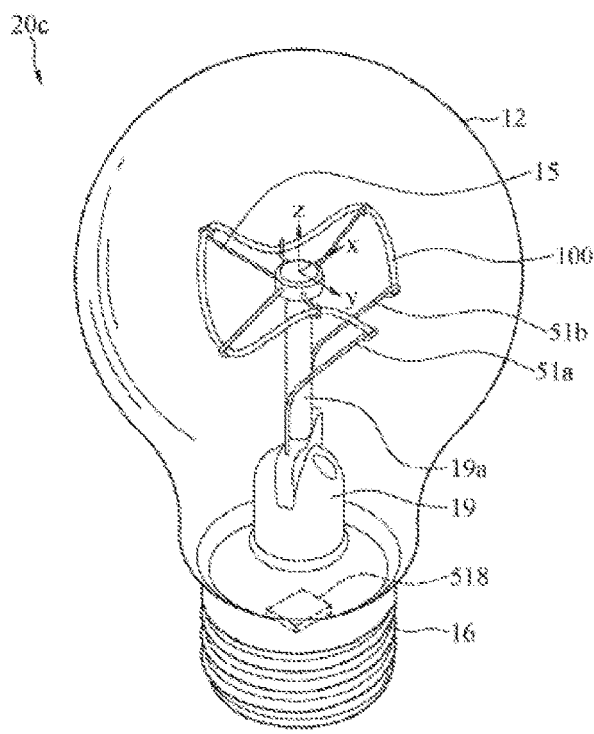
FIG. 5C is a perspective view of an LED light bulb according to an embodiment of the present invention.

Please refer to FIG. 5C. FIG. 5C is a perspective view of an LED light bulb according to an embodiment of the present invention. The LED light bulb 20c shown in FIG. 5C is similar to that shown in FIG. 5A but is added with a xyz coordinates. The LED light bulb 20c shown in FIG. 5C can be referred to the aforementioned description of the LED light bulb 20c shown in FIG. 5A, and it is thus unnecessary to go into details repeatedly. The LED filament 100 shown in FIG. 5C is curved to form a circular shape in a top view while the LED filament is curved to form a wave shape in a side view. The wave shaped structure is not only novel in appearance but also guarantees that the LED filament 100 illuminates evenly. In the meantime, the single LED filament 100, comparing to multiple LED filaments, requires less joint points (e.g., pressing points, fusing points, or welding points) for being connected to the conductive supports 51a, 51b. In practice, the single LED filament 100 (as shown in FIG. 5C) requires only two joint points respectively formed on the two conductive electrodes, which effectively lowers the risk of fault welding and simplifies the process of connection comparing to the mechanically connection in the tightly pressing manner.

Figure 5D:
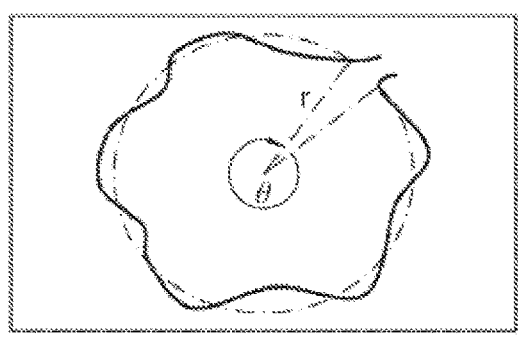
FIG. 5D is a projection of a top view of an LED filament of an LED light bulb of FIG. 5C.

Please refer to FIG. 5D. FIG. 5D is a projection of a top view of an LED filament of the LED light bulb 20c of FIG. 5C. As shown in FIG. 5D, in an embodiment, the LED filament may be curved to form a wave shape observed in a top view to surround the center of the light bulb or the stem. In different embodiments, the LED filament observed in the top view can form a quasi-circle or a quasi U shape.

In an embodiment, the LED light bulb 20c shown in FIG. 5C may be a light bulb with an A size. The two joint points for electrical connection between the two conductive supports 51a, 51b and the LED filament 100 is spaced by a distance, which is within 3 cm and is preferably within 2 cm. The LED filament 100 surrounds with the wave shape; therefore, the LED filament 100 may generate an effect of an omnidirectional light, and the two joint points may be close to each other such that the conductive supports 51a, 51b are substantially below the LED filament 100. Visually, the conductive supports 51a, 51b keeps a low profile and is integrated with the LED filament 100 to show an elegance curvature. While being observed from a side of the LED filament 100 in the LED light bulb 20c, a distance between the highest point and the lowest point of the wave of the LED filament 100 is from 2.2 cm to 3.8 cm and is preferably from 2.2 cm to 2.8 cm. Thus it could be ensured that there would be a space for heat dissipation above the LED filament 100.

As shown in FIG. 5C, the shape of the LED filament 100 may satisfy a curve equation. The position of the LED filament 100 in space relates to the Cartesian coordinates (i.e., an xyz coordinates) shown in FIG. 1. An x-y plane of the xyz coordinates is a plane passing through a top of the stem 19 (i.e., a top of the stand 19a in the embodiment in which the stand 19a is deemed as a part of the stem 19). An origin of the xyz coordinates is at the top of the stem 19 (the origin may be at a center of a sphere body of a bulb shell of a light bulb without any stems). The x-y plane is perpendicular to a height direction of the LED light bulb 20c.

The two conductive electrodes (i.e., the welding points, the joint points, the contacting points, or the fusing points) are symmetrically disposed at two sides of a y-axis of the xyz coordinates. A z-axis of the xyz coordinates is coaxial with stem 19 (or is coaxial with a central axis passing through a horizontal plane of the LED light bulb 20c). The shape of the LED filament 100 varies along an x-direction, a y-direction, and a z-direction according to t, and t is a variable between 0 and 1. A position of points of the LED filament 100 in the xyz coordinates is defined as X, Y, and Z and satisfies the curve equation. Herein, the term "points of the LED filament" means "most of points of the LED filament", or "more than 60% of points of the LED filament." The curve equation is:

$X=m1*\cos(t*360)$, $Y=m2*\sin(t*360)$, $Z=n*\cos(t*360*k)$,

The LED filament 100 varies along the x-direction, the y-direction, and the z-direction according to t. When $X=0$, $|Y|\max=m2$ (a max value of $|Y|$ is m2), and $|Z|\max=n$ (a max value of $|Z|$ is n). When $Y=0$, $|X|\max=m1$ (a max value of $|X|$ is m1), and $|Z|\max=n$ (the max value of $|Z|$ is n). When $Z=0$, $|X|\max=m1$ (the max value of $|X|$ is m1), and $|Y|\max=m2$ (the max value of $|Y|$ is m2). m1 is a length (projection length) in the x-direction, and $24\leq m1\leq 27$ (mm). m2 is a length (projection length) in the y-direction, and $24\leq m2\leq 27$ (mm). Based upon the above configuration, the LED filament 100 in the bulb shell 12 may provide good luminous flux. n is a height of the highest point of the LED filament 100 from the x-y plane in the z-direction, and $0<n\leq 14$ (mm). Based upon the above condition, wires in turning points of the LED filament 100 may hard to break. k is a number of the highest point(s). The more the supporting arms (or supporting bars), the hard the manufacture is; therefore, k is configured as: $2\leq k\leq 8$. A curve line drawn by the above curve equation may be deemed as a reference for the LED filament 100 being distributed in space. According to conditions of different arts and equipment, the configuration of the LED filament 100 in practice may have about 0 to 25% in spatial difference different from the reference based upon the curve equation. Certain region(s) on the filament with supporting point(s) may be relatively highest point(s) and lowest point(s). The spatial difference of the certain region(s) may be less, e.g., 0 to 20%. In an embodiment, r is the radius of a cross section of the bulb shell on the horizontal plane. Cross sections of the bulb shell on the horizontal plane from the bottom to the top of the bulb shell along the height direction may have varied radii, and the radius r is the one with the largest value. In such case, the values of m1, m2, and n may be set as: $0.8*r\leq m1\leq 0.9*r$; $0.8*r\leq m2\leq 0.9*r$; $0<n\leq 0.47*r$. Additionally, p is the radius of an interface of the bulb base utilized for being connected to the bulb shell, G is the length of the LED filament, and, in such case, the values of G may be set as: $1.2*p\leq G\leq 5.6*r$. Based upon the above setting, the LED filament may not only achieve the aforementioned effect, but may also need the least length and the least number of the LED chips. As a result, the cost of materials for the manufacture of the LED light bulb may reduce, and the temperature of the LED light bulb during operation can be suppressed.

In another embodiment, as shown in FIG. 5D, a projection of the LED filament 100 on the x-y plane may be deemed as a quasi-circle. r is a distance from a center point defined by the projection to the projection itself r is deemed as a radius of the projection the LED filament 100. θ is an angle of an arc formed by the projection. θ of a projection point of one of the two ends of the LED filament 100 is 0. The arc angle θ is from 180° to 360°. In certain embodiments, the LED filament 100 may be adjusted via the height in the z-axis to form an arc of which θ is greater than 360°. According to different arts and equipment, the radius r of the projection of the LED filament 100 may have variations with about ±20% difference. A relation between the LED filament 100 varying along the z-axis and θ satisfies a function: $Z=n*\cos(k\theta+\pi)$, wherein n is a height of the highest point from the x-y plane in the z-direction, and $0<n\leq 14$ (mm); k is a number of the highest point(s), and $2\leq k\leq 8$. According to different arts and equipments, these parameters may have variations with about ±20% difference.

Additionally, the inner shape (the hole shape) of the clamping portion 15a fits the outer shape of the cross section of the LED filament 100; therefore, based upon a proper design, the cross section may be oriented to face towards a predetermined orientation. For example, as shown in FIG.

5B, the top layer 420a of the LED filament 100 is oriented to face towards ten o'clock. A lighting face of the whole LED filament 100 may be oriented to face towards the same orientation substantially to ensure that the lighting face of the LED filament 100 is visually identical. The LED filament 100 comprises a main lighting face and a subordinate lighting face corresponding to the LED chips. If the LED chips in the LED filament 100 are wire bonded and are aligned in line, a face of the top layer 420a away from the base layer 420b is the main lighting face, and a face of the base layer 420b away from the top layer 420a is the subordinate lighting face. The main lighting face and the subordinate lighting face are opposite to each other. When the LED filament 100 emits light, the main lighting face is the face through which the largest amount of light rays passes, and the subordinate lighting face is the face through which the second largest amount of light rays passes. In the embodiment, there is, but is not limited to, a conductive foil 530 formed between the top layer 420a and the base layer 420b, which is utilized for electrical connection between the LED chips. In the embodiment, the LED filament 100 wriggles with twists and turns while the main lighting face is always towards outside. That is to say, any portion of the main lighting face is towards the bulb shell 12 or the bulb base 16 at any angle, and the subordinate lighting face is always towards the stem 19 or towards the top of the stem 19 (the subordinate lighting face is always towards inside). Whereby, the LED light bulb 20c as a whole may generate an effect of an omnidirectional light close to a 360 degrees illumination.

Figure 5E:
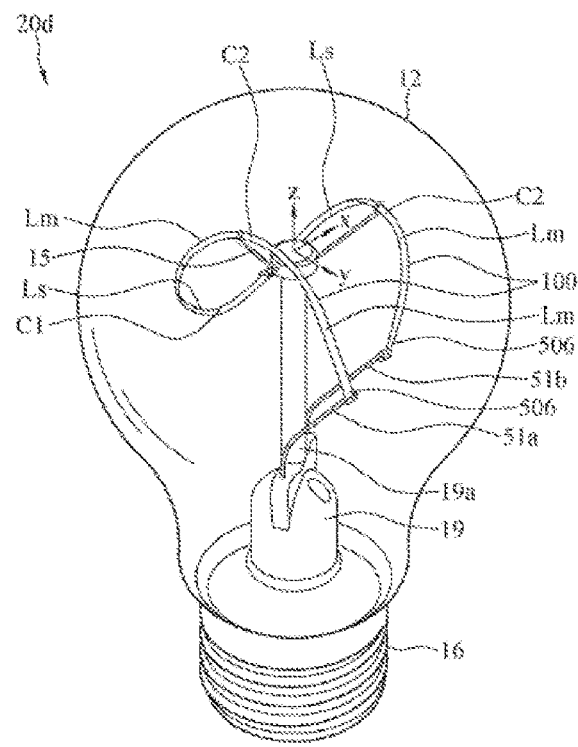
FIG. 5E is a perspective view of an LED light bulb according to an embodiment of the present invention.

Please refer to 5E. FIG. 5E is a perspective view of an LED light bulb according to an embodiment of the present invention. The LED light bulb 20d shown in FIG. 5E is analogous to the LED light bulb 20c shown in FIGS. 5A and 5C. As shown in FIG. 5E, the LED light bulb 20d comprises a bulb shell 12, a bulb base 16 connected to the bulb shell 12, two conductive supports 51a, 51b disposed in the bulb shell 12, supporting arms 15, a stem 19, and one single LED filament 100d. The stem 19 comprises a stem bottom and a stem top opposite to each other. The stem bottom is connected to the bulb base 16. The stem top extends to inside of the bulb shell 12 (to the center of the bulb shell 12). For example, the stem top may be substantially located at a center of the inside of the bulb shell 12. In the embodiment, the stem 19 comprises the stand 19a. Herein the stand 19a is deemed as a part of the whole stem 19 and thus the top of the stem 19 is the same as the top of the stand 19a. The two conductive supports 51a, 51b are connected to the stem 19. The LED filament 100d comprises a filament body and two conductive electrodes 506. The two conductive electrodes 506 are at two opposite ends of the filament body. The filament body is the part of the LED filament 100d without the conductive electrodes 506. The two conductive electrodes 506 are respectively connected to the two conductive supports 51a, 51b. The filament body is around the stem 19. An end of the supporting arm 15 is connected to the stem 19 and another end of the supporting arm 15 is connected to the filament body.

Figure 5F:
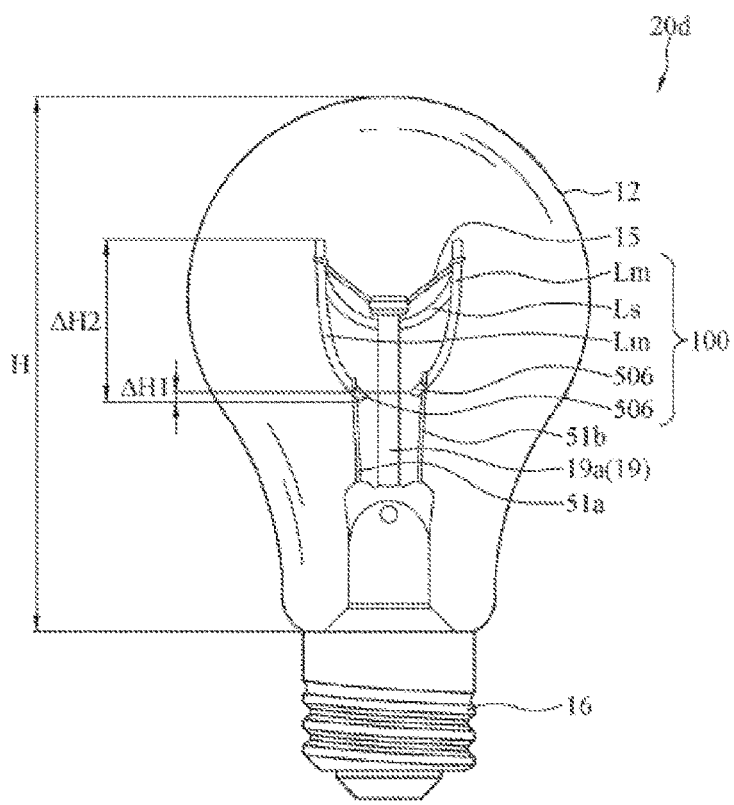
FIG. 5F is a front view of an LED light bulb of FIG. 5E.
Figure 5G:
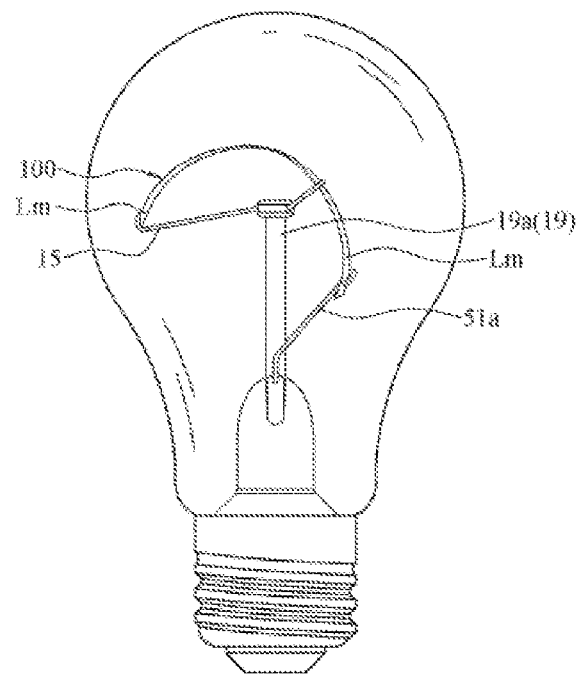
FIG. 5G is a side view of an LED light bulb of FIG. 5E.
Figure 5H:
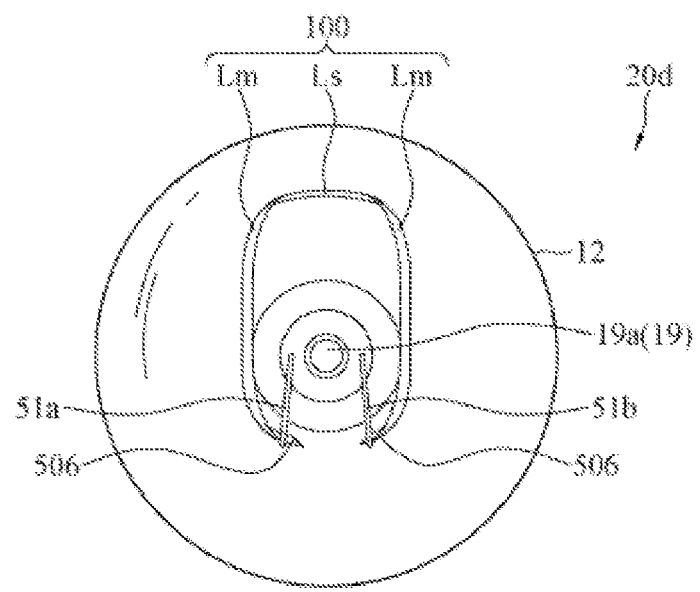
FIG. 5H is a top view of an LED light bulb of FIG. 5E.

Please refer to FIG. 5E to FIG. 5H. FIG. 5F is a front view of an LED light bulb of FIG. 5E. FIG. 5G is a side view of the LED light bulb of FIG. 5E. FIG. 5H is a top view of the LED light bulb of FIG. 5E. In a height direction of the LED light bulb 20d (i.e., the z-direction), H is a distance from a bottom of the bulb shell 12 to a top of the bulb shell 12, and a first height difference $\Delta H1$ is defined between the two conductive electrodes 506. The first height difference $\Delta H1$ is from 0 to $1/10H$. In other words, the minimum of the height difference between the two conductive electrodes 506 may be 0 and, in such case, the two conductive electrodes 506 are at the same level. The maximum of the height difference between the two conductive electrodes 506 may be $1/10H$. Preferably, the first height difference $\Delta H1$ may be from 0 to $1/20H$. In an embodiment, the first height difference $\Delta H1$ may be from 0 mm to 5 mm. In addition, the first height difference $\Delta H1$ may be from 1 mm to 5 mm. Further, the first height difference $\Delta H1$ may be from 1 mm to 2 mm.

In an embodiment, the minimum straight-line distance between the two conductive electrodes 506 is less than 3 cm. In the height direction, the two conductive electrodes 506 are located between $1/2H$ and $3/4H$ from the bottom of the bulb shell 12.

As shown in FIG. 5F, the filament body is curved and rises and falls to form a highest point and a lowest point. A second height difference $\Delta H2$ is defined between the highest point and the lowest point. In the embodiment, the lowest point of the filament body is an end adjacent to the conductive electrode 506. In another embodiment, if the filament body has a downward curving portion (which is curved towards the bulb base 16) lower than the conductive electrodes 506 in the z-direction, the lowest point is on the downward curving portion of the filament body. The first height difference $\Delta H1$ is less than the second height difference $\Delta H2$. The second height difference $\Delta H2$ is from $2/10H$ to $4/10H$. In an embodiment, the second height difference $\Delta H2$ is from 2.2 cm to 3.8 cm, and, preferably, the second height difference $\Delta H2$ is from 2.2 cm to 2.8 cm.

In an embodiment, all of the highest point(s) and the lowest point(s) are between $1/3H$ to $4/5H$ from the bottom of the bulb shell in the height direction (i.e., the z-direction). Additionally, the filament body between the two conductive electrodes 506 is a lighting segment. More than 50% (preferably 95%) of a height of the lighting segment is higher than the two conductive electrodes 506 in the height direction. Preferably, more than 30% of the height of the lighting segment is higher than the stem top of the stem 19 (i.e., the top of the stand 19a) in the height direction.

In an embodiment, when the LED light bulb 20d is projected to a side projection plane parallel with the height direction of the LED light bulb 20d (the z-direction), a filament side projection of the filament body on the side projection plane (which may be referred to FIG. 5F and FIG. 5G) comprises a highest point and a lowest point. A height difference is defined between the highest point and the lowest point of the filament side projection in the height direction. The height difference is from $1/8$ to $3/8$ of the height H of the bulb shell 12.

In an embodiment, when the LED light bulb 20d is projected to a horizontal projection plane perpendicular to the height direction of the LED light bulb 20d (which may be referred to FIG. 5H), a filament horizontal projection of the filament body on the horizontal projection plane is of a quasi-circle or a quasi U shape. As shown in FIG. 5H, the filament horizontal projection of the filament body on the horizontal projection plane is of a quasi U shape. In addition, a shortest distance between the two ends of the filament horizontal projection (two projection points of the two conductive electrodes 506 on the horizontal projection plane) is from 0 cm to 3 cm.

In an embodiment, the filament body is around the stem 19 by an angle greater than 270 degrees. For example, as shown in FIG. 5D and FIG. 5H, The arc angle θ of the projection of the filament body on the x-y plane is greater than 270 degrees. Consequently, the effect of illumination is better. In different embodiments, as shown in FIG. 5D, r is the distance from the center point defined by the filament horizontal projection to the projection itself. θ is an arc angle formed by the filament horizontal projection, and θ is greater than or equal to 30 degrees and is less than or equal to 360 degrees. In an embodiment, a number of the LED filament 100 is one, and, in such case, when the LED light bulb 20d is projected to a projection plane at a particular angle (which may be referred to a side view of the LED light bulb 20d), a projection of the two conductive supports 51a, 51b overlaps (only the conductive support 51a is shown in FIG. 5G while the conductive supports 51a, 51b overlap with each other), a projection of the filament body crosses over two sides of a projection of the stem 19, and the projection of the two conductive supports 51a, 51b is at one of the two sides of the projection of the stem 19. Because the projections of the conductive supports 51a, 51b are at the same side of the projection of the stem 19, i.e., there is no conductive support at the other side of the projection of the stem 19, the light emitted from the LED filament 100 is hard to be blocked, and it is easier to align or correct the posture of the LED light bulb 20d.

In an embodiment, the filament body comprises multiple LED chips which are wire bonded and are aligned in line, and, as aforementioned, the filament body is defined with the main lighting face and the subordinate lighting face opposite to each other in accordance with the LED chips. In the embodiment, as shown in FIG. 5E to FIG. 5H, the filament body comprises a main lighting face Lm and a subordinate lighting face Ls. Any portion of the main lighting face Lm is towards the bulb shell 12 or the bulb base 16 at any angle, and any portion of the subordinate lighting face Ls is towards the stem 19 or towards the top of the stem 19, i.e., the subordinate lighting face Ls is towards inside of the LED light bulb 20d or towards the center of the bulb shell 12. In other words, when a user observes the LED light bulb 20d from outside, the user would see the main lighting face Lm of the LED filament 100d at any angle. Based upon the configuration, the effect of illumination is better.

In the embodiment, as shown in FIG. 5E to FIG. 5H, the shape of the LED filament 100d satisfies the aforementioned curve equation: $X=m1*\cos(t*360)$, $Y=m2*\sin(t*360)$, and $Z=n*\cos(t*360*k)$. The curve equation can be referred to the above description, and it is unnecessary to go into details.

In addition, as shown in FIG. 5E, the LED filament 100d may be defined as the following description according to its appearance. The filament body of the LED filament 100 comprises at least one first curving segment C1 and at least two second curving segments C2. The first curving segment C1 is between the two second curving segments C2. The two conductive electrodes 506 are respectively at an end of each of the two second curving segments C2 away from the first curving segment C1. In the embodiment, multiple supporting arms 15 are respectively connected to bended portions of the first curving segment C1 and the second curving segment C2 to well support different curving segments of the filament body. The first curving segment C1 curves towards a first direction and the second curving segments C2 curve towards a second direction. The first curving segment C1 and the two second curving segments C2 form a wave shaped annular structure.

In the embodiment, as shown in FIG. 5E, the first direction is towards the bulb base 16, and the second direction is away from the bulb base 16. In other words, referred to FIG. 5E, the first curving segment C1 curves downwardly (i.e., the bended portion of the first curving segment C1 is closer to the bulb base 16), and the second curving segments C2 curve upwardly (i.e., the bended portion of the second curving segment C2 is more away from the bulb base 16). In different embodiments, the first direction is away from the bulb base 16, and the second direction is towards the bulb base 16. In other words, the first curving segment C1 curves upwardly and the second curving segments C2 curve downwardly.

In the embodiment, when the LED light bulb 20d is respectively projected to a first side projection plane and a second side projection plane perpendicular to each other and both parallel with the height direction (the z-direction) of the LED light bulb 20d, a projection of the first curving segment C1 and the two second curving segments C2 on the first side projection plane is of a reversed U shape, and a projection of the first curving segment C1 and the two second curving segments C2 on the second side projection plane is of a U shape or an M shape. The first side projection plane may be referred to the side view shown in FIG. 5G, and the filament body shown in FIG. 5G is of a reversed U shape. The second side projection plane may be referred to the front view shown in FIG. 5F, and the filament body shown in FIG. 5F is of an M shape. If a height of a lowest point of the bended portion of the first curving segment C1 is close to that of the conductive electrodes 506, the filament body shown in FIG. 5F is of a U shape. In the embodiment, as shown in FIG. 5H, the projection of the first curving segment C1 and the second curving segments C2 on the horizontal projection plane of the LED light bulb 20d is of a U shape or a reversed U shape (which is a reversed U shape in FIG. 5H according the direction of observation). The horizontal projection plane is perpendicular to the height direction of LED light bulb 20d (the z-direction) and is parallel with the x-y plane.

Figure 5I:
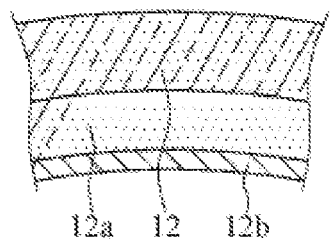
FIG. 5I is a partially enlarged, cross-sectional view of a bulb shell of an LED light bulb according to a first embodiment of the present invention.
Figure 5J:
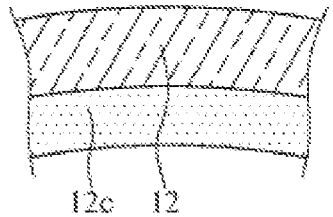
FIG. 5J is a partially enlarged, cross-sectional view of a bulb shell of an LED light bulb according to a second embodiment of the present invention.
Figure 5K:
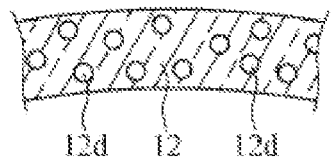
FIG. 5K is a partially enlarged, cross-sectional view of a bulb shell of an LED light bulb according to a third embodiment of the present invention.

Please refer to FIG. 5I to FIG. 5K. FIG. 5I is a partially enlarged, cross-sectional view of a bulb shell of an LED light bulb according to a first embodiment of the present invention. FIG. 5J is a partially enlarged, cross-sectional view of a bulb shell of an LED light bulb according to a second embodiment of the present invention. FIG. 5K is a partially enlarged, cross-sectional view of a bulb shell of an LED light bulb according to a third embodiment of the present invention. The bulb shell 12 comprises an adhesive layer 12a and a diffusing film 12b. The adhesive layer 12a is disposed between the bulb shell 12 and the diffusing film 12b. The adhesive layer 12a may be utilized for enhancing the solidity between the diffusing film 12b and the bulb shell 12. The diffusing film 12b may be utilized for diffusing light rays passing through the bulb shell 12 such that the LED light bulb 20c, 20d may create a more even illumination effect. In addition, the diffusing film 12b may also attach to the bulb shell 12 directly without the adhesive layer 12a. The diffusing film 12b may be attached to an outside or an inside of the bulb shell 12. In other embodiments, the diffusing film 12b may be replaced by a color toning film. The color toning film is capable of adjusting the color temperature of light emitted from the LED light bulb 20c, 20d. Alternatively, the diffusing film 12b may also have the capability of adjusting the color temperature. In such case, for example, the diffusing film 12b may be added with light conversion substances. The light conversion substances may be wavelength conversion particles.

As shown in FIG. 5J, in an embodiment, the bulb shell 12 may comprise an adhesive film 12c to improve the safety of the bulb shell. The adhesive film 12c may be attached to an outside or an inside of the bulb shell 12. In the embodiment, the adhesive film 12c is located at the inside of the bulb shell 12. The material of the adhesive film 12c may be calcium carbonate or strontium phosphate. The thickness of the adhesive film 12c relates to the weight of the LED light bulb

20*c*, 20*d*. If the LED light bulb 20*c*, 20*d* is provided with a heat dissipator (e.g., heat dissipating fins between the bulb shell 12 and the bulb base 16) and the heat dissipator has a weight over 100 grams (the heat dissipator includes 70% of heat conductive glue of 0.7 W/m*K to 0.9 W/m*K), the thickness of the adhesive film 12*c* may be between 200 μm and 300 μm. When the heat dissipator has no heat conductive glue and has a weight below 80 grams, the thickness of the adhesive film 12*c* may be from 40 μm to 90 μm, which is sufficient to prevent explosion. Considering the explosion proof of the Light bulb, a lower bound of the thickness relates to the weight of the light bulb; however, an upper bound of the thickness greater than 300 μm may result in a poor transmittance of light and an increased cost of material. The material of the adhesive film 12*c* may be a combination of calcium carbonate and strontium phosphate. During the manufacturing process of the adhesive film 12*c*, organic solvent may be added and mixed. When the bulb shell 12 is broken, broken pieces of the bulb shell 12 can be connected by the adhesive film 12*c* to avoid breaches so as to prevent users from electric shock due to accidently contacting conductive components inside the broken light bulb.

As shown in FIG. 5K, in an embodiment, the bulb shell 12 may comprise light conversion substances 12*d* in order to changing the color temperature of light emitted from the LED light bulb 20*c*, 20*d*. The bulb shell 12 is capable of adjusting the color temperature of light emitted from the LED light bulb 20*c*, 20*d* by the light conversion substances 12*d*. The light conversion substances 12*d* are mixed with the bulb shell 12. In other words, the light conversion substances 12*d* are added into an original material of the bulb shell 12 during the manufacturing process of the bulb shell 12.

In different embodiments, the color temperature of light emitted from the LED light bulb 20*c*, 20*d* may be adjusted by phosphor powders in a phosphor powder glue/film of the LED light filament 100, 100*d* around the LED chips. In addition, the bulb shell 12, the stem 19, or the stand 19*a* could also be utilized for adjusting the color temperature. For example, the light conversion substances 12*d* may be added in a fritting process while the bulb shell 12 is made by glass to form the bulb shell 12 with the light conversion substances 12*d*, as shown in FIG. 5J. Alternatively, the color toning film with the light conversion substances can be applied to the inside or the outside of the transparent glass. The stem 19/stand 19*a* may also be mixed with the light conversion substances 12*d*.

According to the color temperature, the LED light bulb may be divided into two types, which are for decoration and for illumination. While the LED light bulb is mainly for decoration, the color temperature may be 1700K to 2700K, and the general color rendering index (Ra) may be 70 to 100 and preferably be 90 to 100. While the LED light bulb is mainly for illumination, the color temperature may be 2500K to 3500K, the luminaire efficiency may be 80 lumens/watt to 100 lumens/watt, and the general color rendering index (Ra) may be 60 to 100 and preferably be 80 to 100. Additionally, a diffusing film (e.g., the diffusing film 12*b* shown in FIG. 5I or a diffusing coating) may be applied to the outside or the inside of the bulb shell 12. Alternatively, the diffusing film may be applied to the stem 19 or the stand 19*a*; therefore, the diffusion of light rays may be increased. A main material of the diffusing film may be any one of, a combination of any two of, or a combination of any three of calcium carbonate, halogen calcium phosphate, and aluminum oxide. The diffusing coating mainly formed by calcium carbonate and adequate solution may have a better effect of diffusion and transmittance (the transmittance may be up to 90%). While the diffusing film 12*b* is applied to the outer surface of the bulb shell 12, the friction between the diffusing coating and the bulb base 16 (alternatively the heat dissipator or plastic lamp holder) below the bulb shell 12 is increased, and the issue that the bulb shell 12 may be loose is significantly resolved.

In different embodiments, the composition of the diffusing coating comprises calcium carbonate, strontium phosphate (e.g., white powders of CMS-5000), thickener, and ceramic activated carbon. (e.g., colorless liquid of ceramic activated carbon of SW-C) during compounding, Specifically, while the diffusing coating is mainly made by calcium carbonate compounded with thickener, ceramic activated carbon, and deionized water and is applied to an inner surface or an outer surface of the bulb shell, the thickness of the coating is between 20 μm and 300 μm and preferably is between 20 μm and 30 μm. The diffusing film formed by the above materials may have transmittance about 90%. In general, the transmittance of the diffusing film may range from 85% to 96%. In addition, the diffusing film not only achieves the effect of light diffusing, but also achieves the effect of electric insulation. While the bulb shell is provided with the diffusing film, the risk of electric shock to users in the case of the glass shell being broken is lowered. The diffusing film diffuses light rays while the light source emits light, such that light rays from the light source passing through the diffusing film may be distributed circumferentially to avoid dark spaces and to bring the comfort of illumination. Additionally, different effects may be achieved while the diffusing coating is made by different materials or has different thickness.

In another embodiment, the diffusing coating is mainly made by calcium carbonate and compounded with a few of reflecting material (e.g., strontium phosphate or barium sulfate), thickener, ceramic activated carbon, and deionized water. The compounded diffusing coating is applied to the bulb shell. The mean thickness of the diffusing coating may be between 20 μm and 30 μm. The diffusing file is to make light diffused. In terms of micro observation, the phenomenon of diffusion is the refection of light rays being reflected by particles. The size of particles of reflecting materials such as strontium phosphate or barium sulfate is much greater than that of the calcium carbonate. Thus the diffusing coating added with a few of reflecting material is significantly beneficial of increasing the effect of diffusion.

Nevertheless, in other embodiments, the diffusing coating can be mainly made by halogen calcium phosphate or aluminum oxide. The size of particles of calcium carbonate is substantially between 2 μm and 4 μm. The size of particles of halogen calcium phosphate and aluminum oxide are substantially respectively between 4 μm and 6 μm and between 1 μm and 2 μm. For example, the mean thickness of the diffusing coating mainly made by calcium carbonate is substantially between 20 μm and 30 μm while the transmittance is required to be between 85% and 92%. Under the same requirement of the transmittance (between 85% and 92%), the mean thickness of the diffusing coating mainly made by halogen calcium phosphate is substantially between 25 μm and 35 μm, and the mean thickness of the diffusing coating mainly made by aluminum oxide is substantially between 10 μm and 15 μm. While the transmittance is required to be greater, e.g., greater than 92%, the diffusing coating mainly made by calcium carbonate, halogen calcium phosphate, or aluminum oxide is required to be thinner.

Figure 5L:
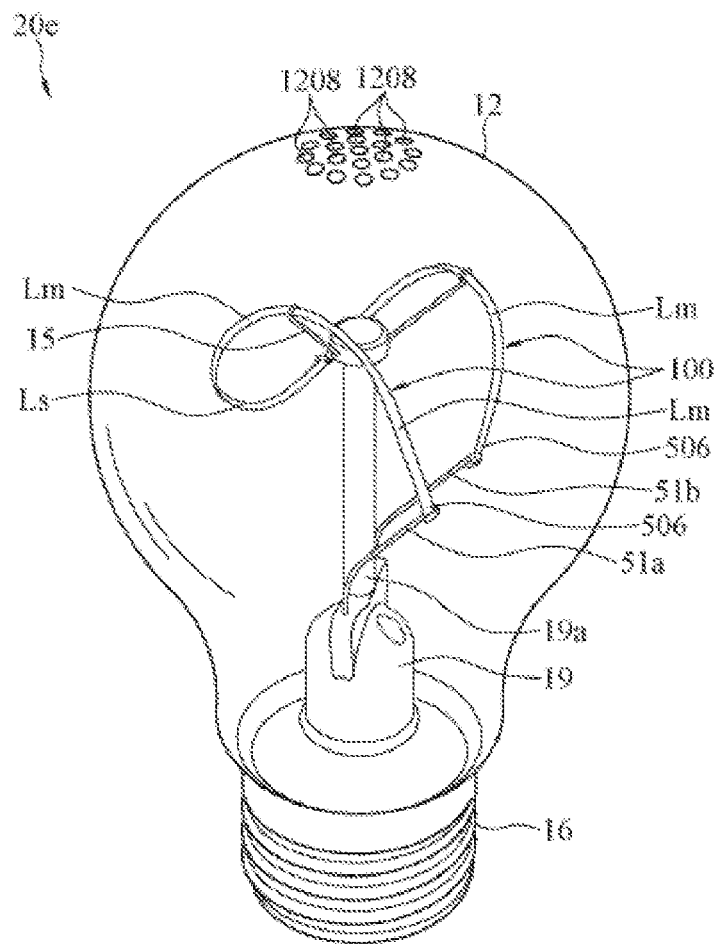
FIG. 5L is a perspective view of an LED light bulb according to another embodiment of the present invention.

Please refer to FIG. 5L. FIG. 5L is a perspective view of an LED light bulb according to another embodiment of the present invention. The difference between the LED light bulb 20e shown in FIG. 5L and the LED light bulb 20d shown in FIG. 5E is that the bulb shell 12 of the LED light bulb 20e shown in FIG. 5L further comprises a plurality of ventilation hole 1208. The ventilation holes 1208 penetrate through the bulb shell 12. The ventilation holes 1208 are distributed on the top of the bulb shell 12 in the height direction and are corresponding to the position of the LED filament 100d to allow the heat of the LED filament 100d generated during operation to be dissipated by air flow through the ventilation holes 1208. In different embodiments, the bulb shell 12 may further comprise a ventilation hole disposed on the bottom of the bulb shell 12.

Figure 5M:
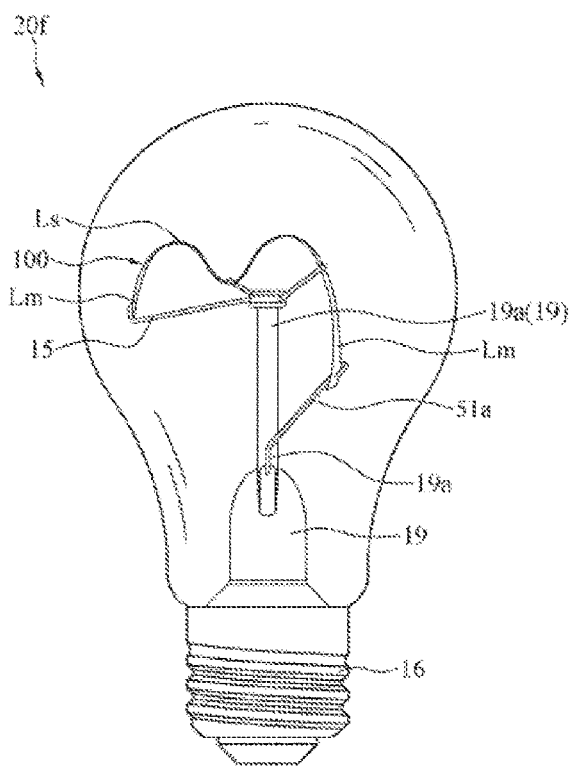
FIG. 5M is a side view of an LED light bulb according to yet another embodiment of the present invention.

Please refer to FIG. 5M. FIG. 5M is a side view of an LED light bulb according to yet another embodiment of the present invention. The difference between the LED light bulb 20f shown in FIG. 5M and the LED light bulb 20d shown in FIG. 5E is that the shape of the LED filament 100 is different from that of the LED filament 100 shown in FIG. 5E. Nevertheless, the variations of the shapes of the LED filaments 100 of FIG. 5E/5M satisfy the aforementioned curve equation. In the embodiment, the LED filament 100 of FIG. 5M has more bending portions than the LED filament 100 of FIG. 5E has. In other embodiments, the shape of the LED filament of the LED light bulb may be varied and is not limited to the embodiments shown in the drawings if the shape of the LED filament satisfies the curve equation.

Figure 5N:
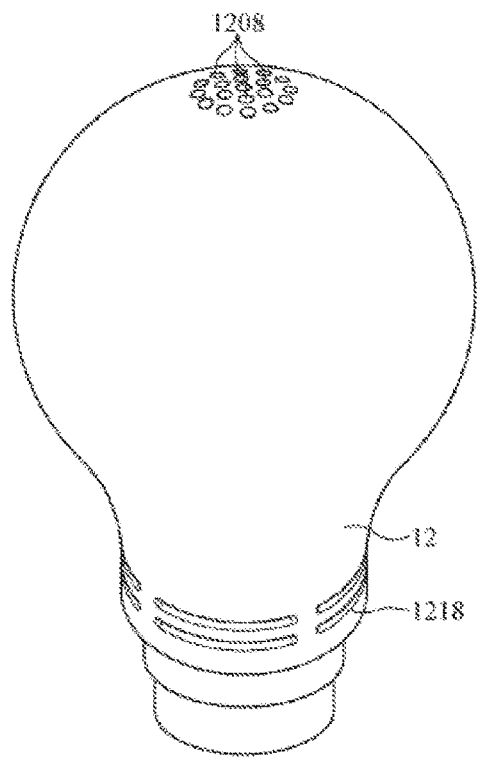
FIG. 5N is a perspective view of a bulb shell of an LED light bulb according to an embodiment of the present invention.

Please refer to FIG. 5N. FIG. 5N is a perspective view of a bulb shell of an LED light bulb according to an embodiment of the present invention. In the embodiment, the bulb shell 12 comprises two sets of ventilation holes 1208, 1218. The ventilation holes 1208 are disposed on the top of the bulb shell 12 in the height direction of the LED light bulb. The ventilation holes 1218 are disposed on the bottom of the bulb shell 12 in the height direction of the LED light bulb. In an embodiment, an area of an opening of the ventilation hole 1208 on the top of the bulb shell 12 is between 100 mm² and 500 mm² and is preferably between 150 mm² and 450 mm². An area of an opening of the ventilation hole 1218 on the bottom of the bulb shell 12 is between 200 mm² and 1200 mm² and is preferably between 450 mm² and 1000 mm². The two sets of ventilation holes 1208, 1218 are benefit to the convection of air.

As the above description, during the manufacturing process of the traditional light bulb, a horn stem may cover the opening of the glass bulb housing for seal sintering. Since the material of both of them is glass, they may be melted after a high temperature sintering to achieve a seal. However, some of the above embodiments use the metal stem 14, and thus the sintering seal effect of the metal and the glass does not achieve the effect like the glass horn stem. Therefore, as an embodiment, a structure of the heat sink 17 connected to the metal stem 14 is adjusted to achieve the object for sealing the bulb housing of the light bulb. As shown in FIG. 4B, the outline of the heat sink 17 is like a cap covering the opening of the bulb housing (i.e. bulb shell) 12, and the edge thereof has a bending part 1702 and connected to a glass of the opening of the bulb housing 12.

While the present invention has been described by way of example and in terms of the preferred embodiments, it is to be understood that the present invention needs not be limited to the disclosed embodiments. For anyone skilled in the art, various modifications and improvements within the spirit of the present invention are covered under the scope of the present invention. The covered scope of the present invention is based on the appended claims.

What is claimed is:

1. An LED light bulb comprising:
   a light transmissive envelope, having a bulbous main chamber;
   a base, connected with the light transmissive envelope by a neck of the light transmissive envelope;
   a stem press located in the light transmissive envelope;
   an upper LED filaments and a lower LED filament both housed in the light transmissive envelope;
   a pair of lead wires,
   a rectifier disposed within the base, having a circuit board in electrical communication with the pair of lead wires, and
   two sets of support wires attached to the stem press at a first end and to the upper LED filaments and the lower LED filament at a second end, the two sets of support wires comprising an upper set of support wires configured to hold the upper LED filament in position, and a lower set of support wires configured to hold the lower LED filament in position;
   wherein the upper LED filaments and the lower LED filament respectively defines a sinuous curve along an arc meandering substantially horizontally in the light transmissive envelope;
   wherein the upper LED filament defines a higher sinuous curve oscillating in the range from H3+A3 to H3−A3 on y-axis, where H3 represents the average height of the upper LED filament in the LED light bulb and A3 the amplitude of the upper sinuous curve the upper LED filament defines;
   wherein the lower LED filament defines a lower sinuous curve oscillating in the range from H4+A3 to H4−A3 on y-axis, where H4 represents the average height of the lower LED filament in the LED light bulb and A3 the amplitude of the lower sinuous curve the lower LED filament defines.

2. The LED light bulb as claimed in claim 1, wherein H4 is less than H3 on the y-axis.

3. The LED light bulb as claimed in claim 2, wherein the two sets of support wires have a same length R, and a posture of the upper LED filament in the LED light bulb is defined by all points in the set (x, y, z+H3), where −R=<x=<R; −R=<y=<R; and −A3=<z=<A3.

4. The LED light bulb as claimed in claim 3, wherein a posture of the lower LED filament in the LED light bulb is defined by all points in the set (x, y, z+H4), where −R=<x=<R; −R=<y=<R; and −A3=<z=<A3.

5. The LED light bulb as claimed in claim 4, wherein the pair of lead wires are parallelly spaced apart from each other.

6. The LED light bulb as claimed in claim 5, wherein an upper portion of the pair of lead wire is attached to the upper LED filament and the lower LED filament.

7. The LED light bulb as claimed in claim 6, wherein an intermediate portion of the pair of lead wire is fixedly attached to a basal portion of the stem press by passing through the basal portion.

8. The LED light bulb as claimed in claim 7, wherein the lower portion of the pair of lead wire is fixedly attached to the rectifier.

9. The LED light bulb as claimed in claim 8, wherein the circuit board includes an L-shaped aperture cut into circumference of the circuit board.

10. The LED light bulb as claimed in claim 9, wherein the pair of lead wires both include a hook configured to interlock the aperture for reliable soldering between the lead wire and the circuit board.

11. The LED light bulb as claimed in claim 10, wherein the pair of lead wires has a length D (mm), D=A+√(B−3.2)^2+C^2), where A is the aggregate of the thickness of the circuit board and the length of the pair of lead wire projecting downwards from the circuit board, B is the distance between the pair of lead wires, and C is distance from entry point of the pair of lead wires into the basal portion to the entry point of the pair of lead wires into the circuit board.

12. The LED light bulb as claimed in claim 11, wherein the length of the pair of lead wires to reach the lower LED filament is from 0.5 D to 2D.

13. The LED light bulb as claimed in claim 12, wherein the length of the pair of lead wires to reach the lower LED filament is from 0.75 D to 1.5 D.

14. The LED light bulb as claimed in claim 13, wherein the length of the lead wire to reach the upper LED filament is L1+(H3−H4).

15. The LED light bulb as claimed in claim 14, wherein a layer of reflective materials is coated to the support wire, the stem press, the upper surface of the base in the light transmissive envelope or any combination thereof.

16. The LED light bulb as claimed in claim 15, wherein points of the LED filament in an xyz coordinates are defined as X, Y, and Z and satisfy a curve equation, an origin of xyz coordinates is at the stem top, an x-y plane of the xyz coordinates passes through the stem top and is perpendicular to the height direction, a z-axis of xyz coordinates is coaxial with stem, and the two conductive electrodes are symmetrically disposed at two sides of a y-axis of the xyz coordinates, the curve equation is:

$$X=m1*\cos(t*360),$$

$$Y=m2*\sin(t*360),$$

$$Z=n*\cos(t*360*k),$$

Wherein, t is a variable between 0 and 1, the LED filament varies along an x-direction, a y-direction, and a z-direction according to t; wherein, when X=0, a max value of |Y| is m2, and a max value of |Z| is n; wherein, when Y=0, a max value of |X| is m1, and a max value of |Z| is n; wherein, when Z=0, a max value of |X| is m1, and a max value of |Y| is m2; wherein m1 is a length in the x-direction, m2 is a length in the y-direction, n is a height of the highest point from the x-y plane in the z-direction, and k is a number of the highest point.

* * * * *